(12) United States Patent
Kubouchi

(10) Patent No.: US 11,257,910 B2
(45) Date of Patent: Feb. 22, 2022

(54) SEMICONDUCTOR DEVICE INCLUDING TRANSISTOR PORTION AND DIODE PORTION

(71) Applicant: FUJI ELECTRIC CO., LTD., Kanagawa (JP)

(72) Inventor: Motoyoshi Kubouchi, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 17/001,694

(22) Filed: Aug. 25, 2020

(65) Prior Publication Data
US 2021/0111253 A1    Apr. 15, 2021

(30) Foreign Application Priority Data
Oct. 11, 2019   (JP) .............................. JP2019-187825

(51) Int. Cl.
| | |
|---|---|
| *H01L 29/32* | (2006.01) |
| *H01L 27/06* | (2006.01) |
| *H01L 29/739* | (2006.01) |
| *H01L 29/40* | (2006.01) |
| *H01L 29/861* | (2006.01) |
| *H01L 29/10* | (2006.01) |
| *H01L 29/78* | (2006.01) |

(52) U.S. Cl.
CPC .......... *H01L 29/32* (2013.01); *H01L 27/0664* (2013.01); *H01L 29/1095* (2013.01); *H01L 29/407* (2013.01); *H01L 29/7397* (2013.01); *H01L 29/7804* (2013.01); *H01L 29/8613* (2013.01)

(58) Field of Classification Search
CPC . H01L 29/7805; H01L 29/7084; H01L 29/32; H01L 29/1095; H01L 29/407; H01L 29/7397; H01L 29/8613; H01L 27/0664
See application file for complete search history.

(56) References Cited

U.S. PATENT DOCUMENTS

| | | | |
|---|---|---|---|
| 10,056,450 B2 | 8/2018 | Kouno | |
| 10,388,773 B2 | 8/2019 | Sumitomo | |
| 10,438,852 B2 | 10/2019 | Kakimoto | |
| 2006/0273385 A1* | 12/2006 | Hshieh .............. | H01L 29/66734 257/330 |
| 2017/0236908 A1* | 8/2017 | Naito ................... | H01L 29/4238 257/48 |

FOREIGN PATENT DOCUMENTS

| | | |
|---|---|---|
| JP | 2015185742 A | 10/2015 |
| JP | 2016029710 A | 3/2016 |
| JP | 2017135255 A | 8/2017 |

\* cited by examiner

*Primary Examiner* — Jesse Y Miyoshi

(57) ABSTRACT

Provided is a semiconductor device, wherein: in a semiconductor substrate, a lifetime control region is provided from at least a part of a transistor portion to a diode portion; the transistor portion includes a main region, a boundary region located between the main region and the diode portion and overlapped with the lifetime control region, and a plurality of gate trench portions; the plurality of gate trench portions include a first gate trench portion provided in the main region and a second gate trench portion provided in the boundary region; and a gate resistance component of the first gate trench portion is different from a gate resistance component of the second gate trench portion.

16 Claims, 34 Drawing Sheets k — k'

100 k — k'

100

SEMICONDUCTOR DEVICE INCLUDING TRANSISTOR PORTION AND DIODE PORTION

The contents of the following Japanese patent application are incorporated herein by reference:
NO. 2019-187825 filed in JP on Oct. 11, 2019.

BACKGROUND

1. Technical Field

The present invention relates to a semiconductor device.

2. Related Art

Conventionally, there is known a technique of a semiconductor device, where a transistor portion such as an insulated gate bipolar transistor (IGBT) and a diode portion are formed in the same substrate. In the semiconductor device, a predetermined depth position of a semiconductor substrate is irradiated with a particle beam such as helium ions, and a lifetime control region which includes a lifetime killer is provided. (for example, Patent Literature 1).

Patent Literature 1: Japanese Unexamined Patent Publication No. 2015-185742

DESCRIPTION OF EXEMPLARY EMBODIMENTS

Figure 1:
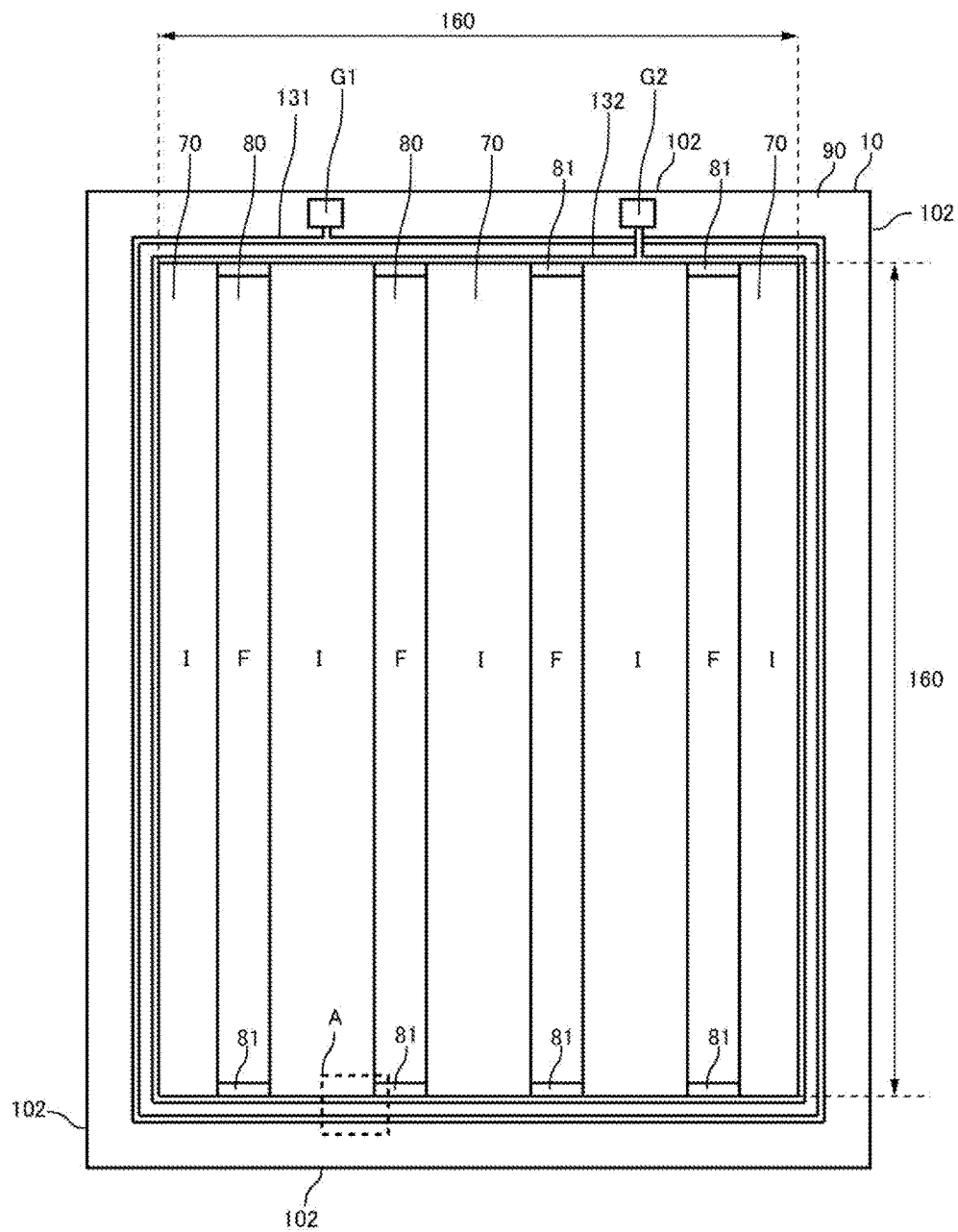
FIG. 1 is a diagram illustrating an example of an upper surface of a semiconductor device 100 according to an embodiment of the invention.

Hereinafter, the invention will be described through embodiments, but the following embodiments do not limit the invention according to the claims. In addition, not all of the combinations of features described in the embodiments are essential to the solving means of the invention.

In the present specification, one side in a direction parallel to the depth direction of a semiconductor substrate is referred to as "upper", and the other side is referred to as "lower". One of the two main surfaces of the substrate, layer, or other members is called an upper surface, and the other surface is referred to as a lower surface. The directions of "up" and "down" are not limited to the direction of gravity or the direction when a semiconductor device is mounted.

In the present specification, technical matters may be described using orthogonal coordinate axes of an X axis, a Y axis, and a Z axis. The orthogonal coordinate axis is merely to specify a relative position of components, and does not limit a specific direction. For example, the Z axis is not limited to a height direction with respect to the ground surface. Further, a +Z axis direction and a −Z axis direction are directions opposite to each other. When the Z axis direction is described without describing the sign, it means that the direction is parallel to the +Z axis and the −Z axis.

In the present specification, the orthogonal axes parallel to the upper surface and the lower surface of a semiconductor substrate are referred to as the X axis and the Y axis. In addition, the axis perpendicular to the upper surface and the lower surface of the semiconductor substrate is referred to as the Z axis. In the present specification, the direction of the Z axis may be referred to as the depth direction. In addition, in the present specification, a direction parallel to the upper surface and the lower surface of the semiconductor substrate, including the X axis and the Y axis, may be referred to as a horizontal direction.

In the present specification, the term "same" or "equal" may include a case where there is an error due to manufacturing variation or the like. The error is within, for example, 10%.

In the present specification, the conductivity type of a doping region doped with impurities is described as a P type or an N type. In the present specification, the impurities may particularly mean any of an N type donor and a P type acceptor, and it may be described as a dopant. In the present specification, doping means that a donor or an acceptor is introduced to the semiconductor substrate to form a semiconductor having an N type conductivity or a semiconductor having a P type conductivity.

In the present specification, a doping concentration means the concentration of a donor or the concentration of an acceptor in a thermal equilibrium state. In the present specification, a net doping concentration means a net concentration obtained by adding the donor concentration as positive ions to the acceptor concentration as negative ions, including the polarities of charges. As an example, when the donor concentration is $N_D$, and the acceptor concentration is $N_A$, the net doping concentration at an arbitrary position becomes $N_D$-$N_A$.

The donor has a function of supplying electrons to the semiconductor. The acceptor has a function of receiving electrons from the semiconductor. The donor and the acceptor are not limited to impurities themselves. For example, a VOH defect caused by a combination of a vacancy (V), an oxygen (O), and a hydrogen (H) existing in the semiconductor functions as a donor to supply electrons.

In the present specification, the term P+ type or N+ type means that its doping concentration is higher than that of the P type or N type, and the term P− type or N− type means that its doping concentration is lower than that of the P type or N type. In addition, in the present specification, the term P++ type or N++ type means that its doping concentration is higher than that of the P+ type or N+ type.

A chemical concentration in the present specification indicates the concentration of impurities, which is measured regardless of the state of electrical activation. The chemical concentration can be measured by, for example, secondary ion mass spectrometry (SIMS). The above-mentioned net doping concentration can be measured by a capacity-voltage method (CV method). In addition, a carrier concentration measured by a spreading resistance profiling method (SRP method) may be used as the net doping concentration. The carrier concentration measured by the CV method or the SRP method may be a value in a thermal equilibrium state. In addition, since the donor concentration is sufficiently larger than the acceptor concentration in the N type region, the carrier concentration in the region may be used as the donor concentration. Similarly, in the P type region, the carrier concentration in the region may be used as the acceptor concentration.

In addition, in a case where the concentration distribution of the donor, the acceptor, or the net doping has a peak, the peak value may be used as the concentration of the donor, the acceptor, or the net doping in the region. In a case where the concentration of the donor, the acceptor, or the net doping is substantially uniform or the like, an average value of the concentration of the donor, the acceptor, or the net doping in the region may be used as the concentration of the donor, the acceptor, or the net doping.

The carrier concentration measured by the SRP method may be lower than the concentration of the donor or the acceptor. In a range where the current flows when measuring a spreading resistance, there is a case where the carrier mobility of the semiconductor substrate is lower than the value of the crystal state. The decrease in carrier mobility occurs by disorder of the crystal structure caused by a lattice defect or the like to make the carrier scatter.

The concentration of the donor or the acceptor calculated from the carrier concentration measured by the CV method or the SRP method may be lower than the chemical concentration of the element indicating the donor or the acceptor. As an example, the donor concentration of phosphorus or arsenic as a donor, or the acceptor concentration of boron as an acceptor in a silicon semiconductor is about 99% of its chemical concentration. On the other hand, the donor concentration of hydrogen as a donor in the silicon semiconductor is about 0.1% to 10% of the chemical concentration of hydrogen.

FIG. 1 is a diagram illustrating an example of the upper surface of a semiconductor device 100 according to an embodiment of the invention. FIG. 1 illustrates positions obtained by projecting members onto the upper surface of a semiconductor substrate 10. In FIG. 1, only some members of the semiconductor device 100 are illustrated, but some members are omitted.

The semiconductor device 100 is provided with the semiconductor substrate 10. The semiconductor substrate 10 includes an edge side 102 when viewed from the upper surface. In the case of simply mentioning "when viewed from the upper surface" in the present specification, it means viewing from the upper surface side of the semiconductor substrate 10. The semiconductor substrate 10 of this example includes two sets of edge sides 102 facing each other when viewed from the upper surface. In FIG. 1, the X axis and the Y axis are parallel with any of the edge sides 102. In addition, the Z axis is perpendicular to the upper surface of the semiconductor substrate 10.

In the semiconductor substrate 10, an active region 160 is provided. The active region 160 is a region in which a main current flows in the depth direction, between the upper surface and the lower surface of the semiconductor substrate 10 in a case where the semiconductor device 100 operates. Above the active region 160, an emitter electrode is provided, but it is omitted in FIG. 1.

In the active region 160, there is provided at least one of a transistor portion 70 which includes a transistor device such as an IGBT, and a diode portion 80 which includes a diode device such as a freewheeling diode (FWD). In the example of FIG. 1, the transistor portion 70 and the diode portion 80 are disposed alternately along a predetermined arrangement direction (the X axis direction in this example) in the upper surface of the semiconductor substrate 10. In another example, only one of the transistor portion 70 and the diode portion 80 may be provided in the active region 160.

In FIG. 1, Symbol "I" is attached to the region where the transistor portion 70 is disposed, and Symbol "F" is attached to the region where the diode portion 80 is disposed. In the present specification, a direction perpendicular to the arrangement direction when viewed from the upper surface may be referred to as an extension direction (the Y axis direction in FIG. 1). The transistor portion 70 and the diode portion 80 may each include a longitudinal side in the extension direction. In other words, the length in the Y axis direction of the transistor portion 70 is larger than the width in the X axis direction. Similarly, the length in the Y axis direction of the diode portion 80 is larger than the width in the X axis direction. The extension direction of the transistor portion 70 and the diode portion 80 and the longitudinal direction of each trench portion described later may be the same.

The diode portion 80 includes an N+ type cathode region in a region in contact with the lower surface of the semiconductor substrate 10. In the present specification, the region where the cathode region is provided is referred to as the diode portion 80. In other words, the diode portion 80 is a region overlapping with the cathode region when viewed from the upper surface. In the lower surface of the semiconductor substrate 10, a P+ type collector region may be provided in the region other than the cathode region. In the present specification, an extension region 81 extending from the diode portion 80 to a gate runner described later in the Y axis direction may also be included in the diode portion 80. In the lower surface of the extension region 81, a collector region is provided.

The transistor portion 70 includes a P+ type collector region in a region in contact with the lower surface of the semiconductor substrate 10. In addition, in the transistor portion 70, there is periodically disposed a gate structure, which includes an N type emitter region, a P type base region, a gate conductive portion, and a gate insulating film, on the upper surface side of the semiconductor substrate 10.

The semiconductor device 100 may include one or more pads above the semiconductor substrate 10. As an example, the semiconductor device 100 illustrated in FIG. 1 includes two gate pads G1 and G2, which is only illustrative. The semiconductor device 100 may also include pads such as an anode pad, a cathode pad, and a current detection pad. Each pad is disposed in the vicinity of the edge side 102. The vicinity of the edge side 102 indicates a region between the edge side 102 and the emitter electrode when viewed from the upper surface. When mounting the semiconductor device 100, each pad may be connected to an external circuit via a wiring such as a wire.

In the gate pads G1 and G2, a gate potential is applied. The gate pads G1 and G2 are electrically connected to the conductive portion of a gate trench portion of the active region 160. The semiconductor device 100 is provided with a gate runner to connect the gate pads G1 and G2 and the gate trench portion.

A first gate runner 131 and a second gate runner 132 are disposed between the active region 160 and the edge side 102 of the semiconductor substrate 10 when viewed from the upper surface. The first gate runner 131 and the second gate runner 132 of this example surround the active region 160 when viewed from the upper surface. The region surrounded by the inside gate runner (the second gate runner 132 in FIG. 1) when viewed from the upper surface may be configured as the active region 160.

As illustrated in FIG. 1, in a case where the semiconductor device 100 includes two gate pads (the gate pads G1 and G2) and two gate runners (the first gate runner 131 and the second gate runner 132), the first gate runner 131 is connected to the gate pad G1, and the second gate runner 132 is connected to the gate pad G2. The first gate runner 131 and the second gate runner 132 are disposed above the semiconductor substrate 10. The first gate runner 131 and the second gate runner 132 of this example may be formed of metal mainly composed of aluminum such as an aluminum silicon alloy.

The semiconductor device 100 of this example is provided with an edge terminal structure portion 90 between the active region 160 and the edge side 102. The edge terminal structure portion 90 of this example is disposed between the first gate runner 131 and the edge side 102. The edge terminal structure portion 90 relaxes an electric field concentration on the upper surface side of the semiconductor substrate 10. The edge terminal structure portion 90 may include a plurality of guard rings. The guard ring is a P type region in contact with the upper surface of the semiconductor substrate 10. With the plurality of guard rings, it is possible to extend a depletion layer on the upper surface side of the active region 160 outward. The withstand voltage of the semiconductor device 100 can be improved. The edge terminal structure portion 90 may be further provided with at least one of a field plate and a RESURF provided annularly around the active region 160.

In addition, the semiconductor device 100 may also be provided with a temperature sense portion (not illustrated) which is a PN junction diode formed of polysilicon or the like, and a current detection portion (not illustrated) which operates similarly to the transistor portion provided in the active region 160.

Figure 2:
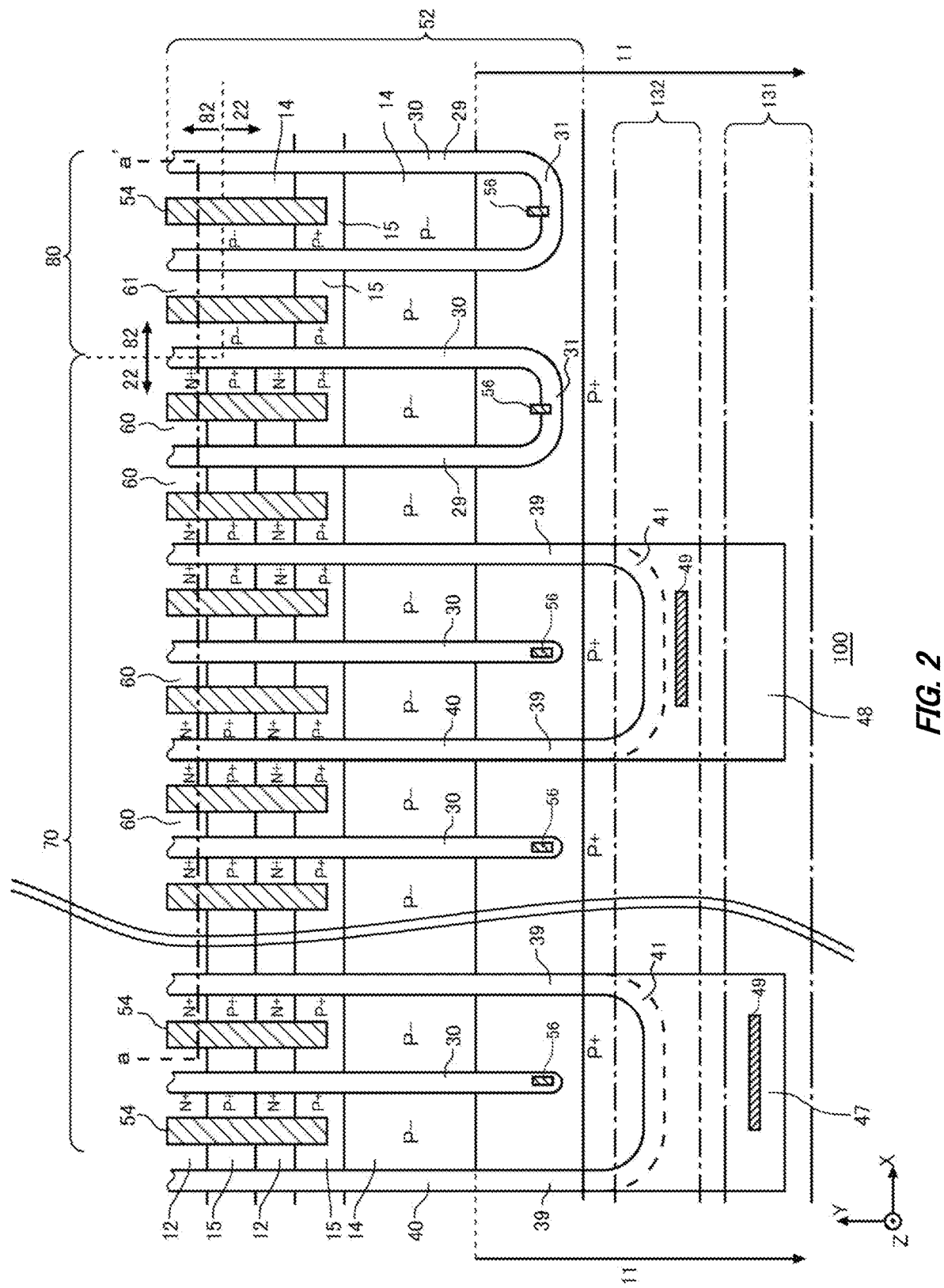
FIG. 2 is an enlarged view of Region A in FIG. 1.

FIG. 2 is an enlarged view of Region A in FIG. 1. Region A includes the transistor portion 70 and the diode portion 80.

The semiconductor device 100 of this example is provided with a gate trench portion 40, a dummy trench portion 30, a well region 11, an emitter region 12, a base region 14, and a contact region 15, which are provided inside the upper surface side of the semiconductor substrate 10. The gate trench portion 40 and the dummy trench portion 30 each are an example of the trench portion. In addition, the semiconductor device 100 of this example includes an emitter electrode 52 which is provided above the upper surface of the semiconductor substrate 10. The emitter electrode 52, the first gate runner 131, and the second gate runner 132 are provided separately from each other.

An interlayer dielectric film is provided between the emitter electrode 52, the first gate runner 131 and the second gate runner 132, and the upper surface of the semiconductor substrate 10, but is omitted in FIG. 2. In the interlayer dielectric film of this example, contact holes 49, 54, and 56 are provided to pass through the interlayer dielectric film. In FIG. 2, each contact hole is hatched with inclined lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate 10 through the contact hole 54. In addition, the emitter electrode 52 is connected to a dummy conductive portion in the dummy trench portion 30 through the contact hole 56. The emitter electrode 52 may be connected to the dummy conductive portion of the dummy trench portion 30 at the edge of the dummy trench portion 30 in the Y axis direction.

The first gate runner 131 and the second gate runner 132 are in contact with a first gate lead-out conductive portion 47 and a second gate lead-out conductive portion 48 through the contact hole 49. The first gate lead-out conductive portion 47 and the second gate lead-out conductive portion 48 are formed of polysilicon or the like doped with impurities. The first gate lead-out conductive portion 47 and the second gate lead-out conductive portion 48 are connected to the gate conductive portion in the gate trench portion 40 in the upper surface of the semiconductor substrate. The first gate runner 131 and the second gate runner 132 are not connected to the dummy conductive portion in the dummy trench portion 30. The first gate lead-out conductive portion 47 and the second gate lead-out conductive portion 48 of this example are provided from below the contact hole 49 to the edge of the gate trench portion 40. An insulating film such as an oxide film is provided between the first gate lead-out conductive portion 47 and the second gate lead-out conductive portion 48, and the upper surface of the semiconductor substrate 10. In the edge of the gate trench portion 40, the gate conductive portion is exposed to the upper surface of the semiconductor substrate. The gate trench portion 40 is in contact with the first gate lead-out conductive portion 47 and the second gate lead-out conductive portion 48 in the exposed portion of the gate conductive portion. The first gate lead-out conductive portion 47 and the second gate lead-out conductive portion 48 may be formed simultaneously at the time of deposition of the gate conductive portion.

The emitter electrode 52 is formed of a material containing metal. For example, at least a partial region of each electrode is formed of aluminum or an aluminum-silicon alloy. Each electrode may have a barrier metal formed of titanium, a titanium compound, or the like in the lower layer of the region formed of aluminum or the like. In addition, each electrode may have a plug formed of tungsten or the like in the contact hole.

The well region 11 is provided overlapping with the first gate runner 131 and the second gate runner 132. The well region 11 is provided to extend with a predetermined width even in a range not overlapping with the first gate runner 131 and the second gate runner 132. The well region 11 of this example is provided to be separated from the end in the Y axis direction of the contact hole 54 toward the first gate runner 131 and the second gate runner 132. The well region 11 is a second conductivity type region in which its doping concentration is higher than that of the base region 14. The base region 14 of this example is a P− type, and the well region 11 is a P+ type. In addition, the well region 11 is formed from the upper surface of the semiconductor substrate 10 to a position deeper than the lower end of the base region 14.

Each of the transistor portion 70 and the diode portion 80 includes a plurality of trench portions arranged in the arrangement direction. In the transistor portion 70 of this example, one or more gate trench portions 40 and one or more dummy trench portions 30 are alternately provided along the arrangement direction. In the diode portion 80 of this example, the plurality of dummy trench portions 30 are provided along the arrangement direction. In the diode portion 80 of this example, the gate trench portion 40 is not provided.

The gate trench portion 40 of this example may include two linear portions 39 (portions of the trench that are linear along the extension direction) extending along the extension direction perpendicular to the arrangement direction, and the edge 41 for connecting the two linear portions 39. The extension direction in FIG. 2 is the Y axis direction.

At least a part of the edge 41 is desirably provided in a curved shape when viewed from the upper surface. The edge 41 connects the end portions in the Y axis direction of two linear portions 39, so that the electric field concentration in the end portion of the linear portion 39 can be relaxed.

In the transistor portion 70, the dummy trench portion 30 is provided between the linear portions 39 of the gate trench portion 40. One dummy trench portion 30 may be provided, or a plurality of dummy trench portions 30 may be provided, between the linear portions 39. The dummy trench portion 30 may be in a linear shape extending in the extension direction, or may include the linear portion 29 and an edge 31 similarly to the gate trench portion 40. The semiconductor device 100 illustrated in FIG. 2 includes both the linear dummy trench portion 30 having no edge 31, and the dummy trench portion 30 having the edge 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 when viewed from the upper surface. In other words, the bottom in the depth direction of each trench portion is covered with the well region 11 at the end portion in the Y axis direction of each trench portion. With this configuration, the electric field concentration on the bottom of each trench portion can be relaxed.

A mesa portion is provided between the trench portions in the arrangement direction. The mesa portion indicates a region interposed between the trench portions inside the semiconductor substrate 10. As an example, the upper end of the mesa portion is the upper surface of the semiconductor substrate 10. The depth position of the lower end of the mesa portion is the same as the depth position of the lower end of the trench portion. The mesa portion of this example is interposed between the adjacent trench portions in the X axis direction, and is provided to extend in the extension direction (Y axis direction) along the trench in the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion indicates each of the mesa portion 60 and the mesa portion 61.

Each mesa portion is provided with the base region 14. In each mesa portion, at least one of the first conductivity type emitter region 12 and the second conductivity type contact region 15 may be provided in the region interposed between the base regions 14 when viewed from the upper surface. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 includes the emitter region 12 exposed to the upper surface of the semiconductor substrate 10. The emitter region 12 is provided in contact with the gate trench portion 40. In the mesa portion 60 in contact with the gate trench portion 40, the contact region 15 exposed to the upper surface of the semiconductor substrate 10 may be provided.

Each of the contact region 15 and the emitter region 12 in the mesa portion 60 is provided from one trench portion in the X axis direction to the other trench portion. As an example, the contact region 15 and the emitter region 12 of the mesa portion 60 are alternately disposed along the extension direction (Y axis direction) of the trench portion.

In another example, the contact region 15 and the emitter region 12 of the mesa portion 60 may be provided in a stripe shape along the extension direction (Y axis direction) of the trench portion. For example, the emitter region 12 is provided in a region in contact with the trench portion, and the contact region 15 is provided in a region interposed between the emitter regions 12.

In the mesa portion 61 of the diode portion 80, the emitter region 12 is not provided. In the upper surface of the mesa portion 61, the base region 14 and the contact region 15 may be provided. In the region interposed between the base regions 14 in the upper surface of the mesa portion 61, the contact region 15 may be provided in contact with each base region 14. In the region interposed between the contact regions 15 in the upper surface of the mesa portion 61, the base region 14 may be provided. The base region 14 may be disposed in the entire region interposed between the contact regions 15.

Above each mesa portion, the contact hole 54 is provided. The contact hole 54 is disposed in the region interposed between the base regions 14. The contact hole 54 of this example is provided above each of the contact region 15, the base region 14, and the emitter region 12. The contact hole 54 may be disposed at the center in the arrangement direction (X axis direction) of the mesa portion 60.

In the diode portion 80, an N+ type cathode region 82 is provided in a region in direct contact with the lower surface of the semiconductor substrate 10. In the lower surface of the semiconductor substrate 10, a P+ type collector region 22 may be provided in the region where the cathode region 82 is not provided. In FIG. 2, the boundary between the cathode region 82 and the collector region 22 is illustrated with a dotted line.

The cathode region 82 is disposed separately from the well region 11 in the Y axis direction. With this configuration, the distance between the P type region (the well region 11) having a relatively high doping concentration and formed up to the deep position, and the cathode region 82 is secured, so that the withstand voltage can be improved. The end portion in the Y axis direction of the cathode region 82 of this example is disposed farther away from the well region 11 than the end portion in the Y axis direction of the contact hole 54. In another example, the end portion in the Y axis direction of the cathode region 82 may be disposed between the well region 11 and the contact hole 54.

Further, the gate runner illustrated in FIG. 1 includes two gate runners, that is, the first gate runner 131 and the second gate runner 132, which is only illustrative. In FIG. 1, the second gate runner 132 is provided inside the first gate runner 131. However, the first gate runner 131 may be provided inside the second gate runner 132. In addition, two gate runners are disposed in parallel with the edge side 102, which is only illustrative. Two gate runners may be disposed up and down in the depth direction (the Z axis direction). Alternatively, the connection between the two gate runners and the gate trench illustrated in FIG. 2 each may be performed only on one side of the opposite edge side 102, so the two gate runners may not run side by side. In addition, in FIG. 1, the connection wiring between the gate pad G2 and the second gate runner 132 is illustrated to be crossed with the first gate runner 131, but is not limited thereto. One gate runner (for example, the first gate runner 131) may not have an crossing portion so as to pass through the outside of the other gate pad (for example, the gate pad G2).

Embodiment 1

Figure 3:
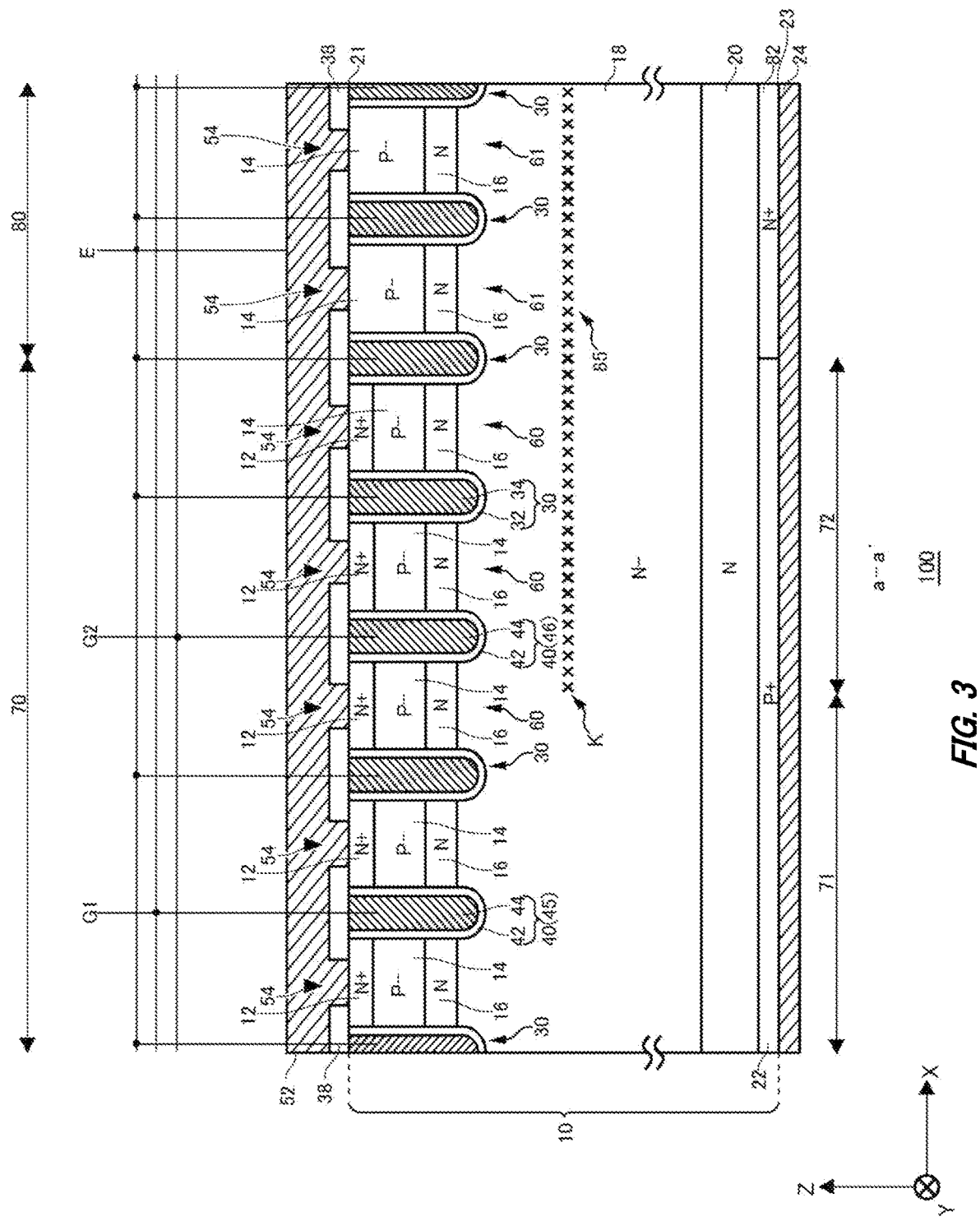
FIG. 3 is a diagram illustrating a partial cross section of the semiconductor device 100 according to Embodiment 1 and electrical connection thereof.

FIG. 3 is a diagram illustrating a partial cross section of the semiconductor device 100 according to Embodiment 1 and electrical connection thereof. As an example, the cross section illustrated in FIG. 3 corresponds to the a-a' cross section in FIG. 2. The a-a' cross section is an XZ plane passing through the emitter region 12, the base region 14, and the gate trench portion 40 and the dummy trench portion 30. The semiconductor device 100 of this example includes the semiconductor substrate 10, an interlayer dielectric film 38, the emitter electrode 52, and a collector electrode 24 in the a-a' cross section.

The interlayer dielectric film 38 is provided in an upper surface 21 of the semiconductor substrate 10. The interlayer dielectric film 38 is a dielectric film such as silicate glass to which impurities such as boron or phosphorus are added. The interlayer dielectric film 38 may be in contact with the upper surface 21, or another film such as an oxide film may be provided between the interlayer dielectric film 38 and the upper surface 21. In the interlayer dielectric film 38, the contact hole 54 described in FIG. 2 is provided.

The emitter electrode 52 is provided in the upper surface 21 of the semiconductor substrate 10 and the upper surface of the interlayer dielectric film 38. The emitter electrode 52 is in electrical contact with the upper surface 21 through the contact hole 54 of the interlayer dielectric film 38. In the contact hole 54, a contact plug such as tungsten (W) may be provided. The collector electrode 24 is provided in a lower surface 23 of the semiconductor substrate 10. The emitter electrode 52 and the collector electrode 24 are formed of a material containing metal.

The semiconductor substrate 10 may be a silicon substrate, a silicon carbide substrate, or a nitride semiconductor substrate or the like such as gallium nitride. The semiconductor substrate 10 of this example is a silicon substrate.

The semiconductor substrate 10 includes a first conductivity type drift region 18. The drift region 18 of this example is an N– type. The drift region 18 may be a remaining region in the semiconductor substrate 10 in which the other doping regions were not provided.

Above the drift region 18, one or more accumulation regions 16 may be provided in the Z axis direction. The accumulation region 16 is a region where the same dopant as that of the drift region 18 is accumulated with a higher concentration than the drift region 18. The doping concentration of the accumulation region 16 has a doping concentration higher than the drift region 18. With the accumulation region 16, it is possible to increase an injection enhancement effect (IE effect) of the carrier so as to lower the ON voltage.

In the transistor portion 70, the emitter region 12 is provided in contact with the upper surface 21 above the base region 14. The emitter region 12 is provided in contact with the gate trench portion 40. The doping concentration of the emitter region 12 is higher than the doping concentration of the drift region 18. Examples of the dopant of the emitter region 12 include arsenic (As), phosphorus (P), antimony (Sb), and the like.

In the mesa portion 61 of the diode portion 80, the contact region 15 is provided in contact with the upper surface 21 above the base region 14. The contact region 15 may be provided in contact with the dummy trench portion 30.

Below the drift region 18, a first conductivity type buffer region 20 may be provided. The buffer region 20 of this example is an N type. The doping concentration of the buffer region 20 is higher than the doping concentration of the drift region 18. The buffer region 20 may serve as a field stopper layer which prevents a depletion layer expanding from the lower surface side of the base region 14 from reaching the collector region 22 and the cathode region 82.

In the diode portion 80, the cathode region 82 is provided below the buffer region 20. The cathode region 82 may be provided at the same depth as the collector region 22 of the transistor portion 70. The diode portion 80 may function as a freewheeling diode (FWD) which allows the freewheeling current to flow in the reverse direction when the transistor portion 70 is turned off.

In the transistor portion 70, the collector region 22 is provided below the buffer region 20. The collector region 22 may be provided in contact with the cathode region 82 in the lower surface 23.

In the semiconductor substrate 10, the gate trench portion 40 and the dummy trench portion 30 are provided. The gate trench portion 40 and the dummy trench portion 30 are provided to extend through the base region 14 and the accumulation region 16 from the upper surface 21, and reach the drift region 18. The configuration that the trench portion extends through the doping region is not limited to the one manufactured in the order of forming the doping region and then forming the trench portion. The configuration that the doping region is formed between the trench portions after forming the trench portion includes a configuration that the trench portion extends through the doping region.

The gate trench portion 40 includes a gate trench provided in the upper surface 21, a gate insulating film 42, and a gate conductive portion 44. The gate insulating film 42 is provided to cover the inner wall of the gate trench. The gate insulating film 42 may be formed by oxidizing or nitriding a semiconductor on the inner wall of the gate trench. The gate conductive portion 44 is provided inside from the gate insulating film 42 in the gate trench. The upper surface of the gate conductive portion 44 may be in the same XY plane as the upper surface 21. The gate insulating film 42 insulates the gate conductive portion 44 from the semiconductor substrate 10. The gate conductive portion 44 is formed of a semiconductor such as polysilicon doped with impurities.

The gate conductive portion 44 may be provided longer than the base region 14 in the depth direction. The gate trench portion 40 is covered by the interlayer dielectric film 38 in the upper surface 21. If a predetermined voltage is applied to the gate conductive portion 44, a channel is formed by an electron inversion layer on the surface layer of the base region 14 at the boundary in contact with the gate trench.

The dummy trench portion 30 may have the same structure as the gate trench portion 40 in the XZ cross section. The dummy trench portion 30 includes a dummy trench provided in the upper surface 21, a dummy insulating film 32, and a dummy conductive portion 34. The dummy insulating film 32 is provided to cover the inner wall of the dummy trench. The dummy insulating film 32 may be formed by oxidizing or nitriding a semiconductor on the inner wall of the dummy trench. The dummy conductive portion 34 is provided inside the dummy insulating film 32 in the dummy trench. The upper surface of the dummy conductive portion 34 may be in the same XY plane as the upper surface 21. The dummy insulating film 32 insulates the dummy conductive portion 34 from the semiconductor substrate 10. The dummy conductive portion 34 may be formed of the same material as the gate conductive portion 44.

The gate trench portion 40 and the dummy trench portion 30 of this example are covered by the interlayer dielectric film 38 in the upper surface 21. Further, the bottoms of the dummy trench portion 30 and the gate trench portion 40 may be formed in a curved-surface shape (a curved-line shape in the cross section) convexly downward.

In the semiconductor substrate 10, a lifetime control region 85 including a lifetime killer is locally provided in the drift region 18. The lifetime control region 85 is formed to suppress a hole current which occurs from the base region 14 to the cathode region 82 at the time of conduction of the diode portion 80, and to reduce a reverse recovery loss. In addition, at the time of conduction of the diode portion 80, the hole current flows from the base region 14 to the proximate cathode region 82 also in the transistor portion 70. Therefore, it is preferable to form the lifetime control region 85.

The lifetime control region 85 may be formed by irradiating a particle beam from the upper surface 21 or the lower surface 23. As an example, a region that is not irradiated with the particle beam in the transistor portion 70 is shielded with a mask, and the transistor portion 70 and the diode portion 80 are irradiated with the particle beam. The region shielded with the mask is not irradiated with the particle beam.

In FIG. 3, peak positions in the Z axis direction of the concentration distribution of the lifetime killer are indicated by a symbol of "x". The peak position in the Z axis direction of the lifetime control region 85 of this example may be equal to the position in the Z axis direction of the lower surface of the well region 11, or may be provided below from the position in the Z axis direction of the lower surface of the well region 11. In addition, the lifetime control region 85 may be formed to include a plurality of peaks of the concentration distribution of the lifetime killer in the Z axis direction.

The lifetime killer is helium implanted into a predetermined depth position as an example. By implanting helium, it is possible to form a crystal defect in the semiconductor substrate 10. The lifetime killer may be a proton or electron beam implanted to a predetermined depth position. Also by implanting an electron beam or proton, it is possible to form a crystal defect in the semiconductor substrate 10.

As illustrated in FIG. 3, the lifetime control region 85 of this example is provided continuously from below the gate trench portion 40 closest to the diode portion 80 to the diode portion 80 in the X axis direction. The lifetime control region 85 is provided continuously from a boundary region 72 to the diode portion 80 in the X axis direction. An end portion K on the negative side of the X axis of the lifetime control region 85 may be disposed below the gate trench portion 40 closest to the diode portion 80.

The transistor portion 70 of this example includes a main region 71 separated from the diode portion 80 and the boundary region 72 located between the main region 71 and the diode portion 80 when viewed from the upper surface.

The main region 71 is a region which is not irradiated with the particle beam of the transistor portion 70, and the boundary region 72 is a region which is irradiated with the particle beam of the transistor portion 70 and overlapped with the lifetime control region 85.

The irradiated particle beam passes through the base region 14 and the gate trench portion 40 in the boundary region 72, for example, in a case where the particle beam is irradiated from the upper surface 21. Therefore, a boundary level of the region in which channels are formed in the base region 14 may be changed. Therefore, the threshold of the boundary region 72 can be lowered. Therefore, a second gate trench portion 46 provided in the boundary region 72 turns on at an early timing and off at a delayed timing, compared to a first gate trench portion 45 provided in the main region 71.

In addition, in a case where the particle beam is irradiated from the lower surface 23, the irradiated particle beam may reach the base region 14 and the gate trench portion 40 in the boundary region 72 due to the variation in irradiation. Therefore, a boundary level of the region in which a channel is formed in the base region 14 may be changed. Therefore, the threshold of the boundary region 72 can be lowered.

The gate trench portion 40 of this example includes the first gate trench portion 45 provided in the main region 71, and the second gate trench portion 46 provided in the boundary region 72. In this example, the gate resistance component of the first gate trench portion 45 is different from the gate resistance component of the second gate trench portion 46.

In the present specification, the gate resistance component refers a summation of all the resistance components in the transmission path of the gate signal from the gate pad to the gate trench portion. For example, the gate resistance component is a summation of the resistance components of the gate pad, the gate runner, the gate conductive portion of the gate trench portion, and all the members connecting these portions.

Embodiment 1 is a configuration example in which the semiconductor device 100 includes two gate pads G1 and G2 and two gate runners, that is, the first gate runner 131 and the second gate runner 132. In this example, the first gate trench portion 45 is electrically connected to the first gate runner 131, and electrically connected to the gate pad G1 through the first gate runner 131. In addition, the second gate trench portion 46 is electrically connected to the second gate runner 132, and electrically connected to the gate pad G2 through the second gate runner 132. Further, in the present specification, the connection with the gate conductive portion in the gate trench portion may be simply referred to as an electrical connection with the gate trench portion.

As described above, by forming the lifetime control region 85, the threshold of the boundary region 72 may be lowered, and the conduction timing may be deviated between the first gate trench portion 45 and the second gate trench portion 46. In this example, the first gate runner 131 and the second gate runner 132 are connected to the different gate pads, so that the signal transmission timing from each of the gate pads can be adjusted, and the conduction timings can be matched in the first gate trench portion 45 and the second gate trench portion 46.

Embodiment 2

Figure 4:
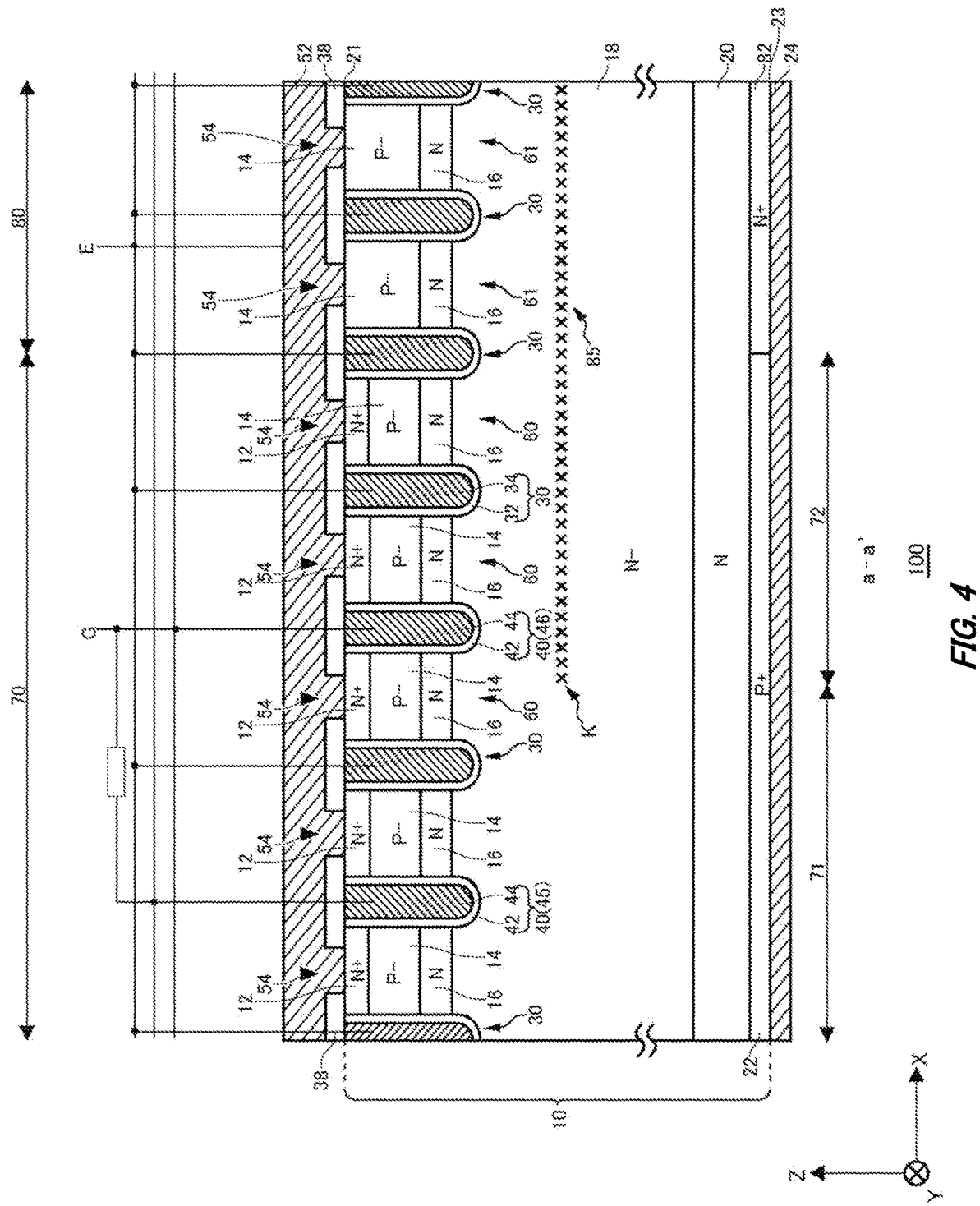
FIG. 4 is a diagram illustrating a partial cross section of the semiconductor device 100 according to Embodiment 2 and electrical connection thereof.

Embodiment 2 is a configuration example in which the semiconductor device 100 includes one gate pad and two gate runners, and the OFF timings are matched. FIG. 4 is a diagram illustrating a partial cross section of the semiconductor device 100 according to Embodiment 2 and electrical connection thereof. As an example, the cross section illustrated in FIG. 4 corresponds to the a-a' cross section in FIG. 2.

The semiconductor device 100 of this example includes one gate pad G and two gate runners (the first gate runner 131 and the second gate runner 132). In other words, the first gate runner 131 and the second gate runner 132 are electrically connected to the same gate pad G.

The gate resistance component of the first gate trench portion 45 of this example is larger than the gate resistance component of the second gate trench portion 46. With this configuration, the signal transmission from the gate pad G to the second gate trench portion 46 becomes faster than the signal transmission to the first gate trench portion 45, and the OFF timings can be matched.

Figure 5:
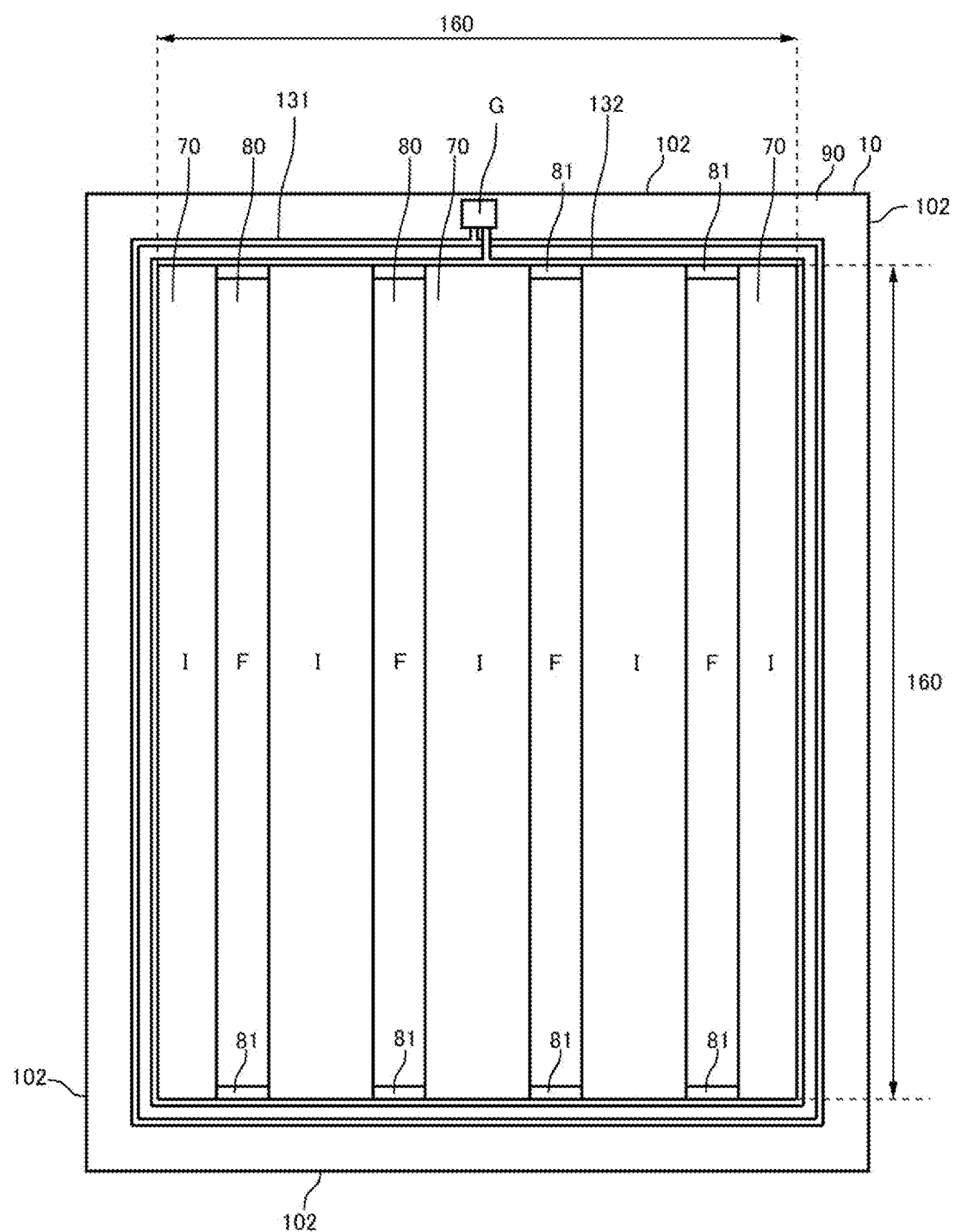
FIG. 5 is a diagram illustrating an upper surface of the semiconductor device 100 according to Embodiment 2.

FIG. 5 is a diagram illustrating the upper surface of the semiconductor device 100 according to Embodiment 2. As an example, the second gate runner 132 is disposed between the first gate runner 131 and the outer periphery of the active region 160. In other words, the extension distance of the second gate runner 132 is shorter than the extension distance of the first gate runner 131. Therefore, the resistance of the second gate runner 132 is smaller than the resistance of the first gate runner 131. With this configuration, the signal transmission from the gate pad G to the second gate trench portion 46 becomes faster than the signal transmission to the first gate trench portion 45, and the OFF timings can be matched.

Alternatively, the first gate runner 131 may be formed of a material different from that of the second gate runner 132. As an example, the first gate runner 131 is formed of polysilicon, and the second gate runner 132 is formed of an aluminum silicon alloy. In other words, the second gate runner 132 formed of an aluminum silicon alloy has a resistance smaller than the first gate runner 131 formed of polysilicon. With this configuration, the signal transmission from the gate pad G to the second gate trench portion 46 becomes faster than the signal transmission to the first gate trench portion 45, and the OFF timings can be matched.

Alternatively, the first gate runner 131 may have a cross-sectional area different from that of the second gate runner 132. In a case where there is a mention as a cross-sectional area of the gate runner in the present specification, it means an area in the XZ cross section or the YZ cross section of each gate runner. As an example, the cross-sectional area of the second gate runner 132 is set larger than the cross-sectional area of the first gate runner 131. In other words, the second gate runner 132 with a larger cross-sectional area has a resistance smaller than the first gate runner 131. With this configuration, the signal transmission from the gate pad G to the second gate trench portion 46 becomes faster than the signal transmission to the first gate trench portion 45, and the OFF timings can be matched.

Further, the same effect can also be obtained by forming a high-resistance wiring region in the middle of the second gate runner 132, or in the middle of connecting the second gate runner 132 and the gate pad G. In the two gate runners illustrated in FIG. 5, the second gate runner 132 is provided inside the first gate runner 131. However, in a case where the two gate runners are formed of different materials, or in a case where the cross-sectional areas are different, the first gate runner 131 may be provided inside the second gate runner 132. Alternatively, the connection between the two gate runners and the gate trench as illustrated in FIG. 2 each may be performed only on one side of the opposite edge side, so the two gate runners may not run side by side. In addition, the connection between the second gate runner 132 and the gate pad G is illustrated to be crossed with the first gate runner 131, but it not limited thereto. The arrangement may be made without an crossing portion.

Embodiment 3

Figure 6:
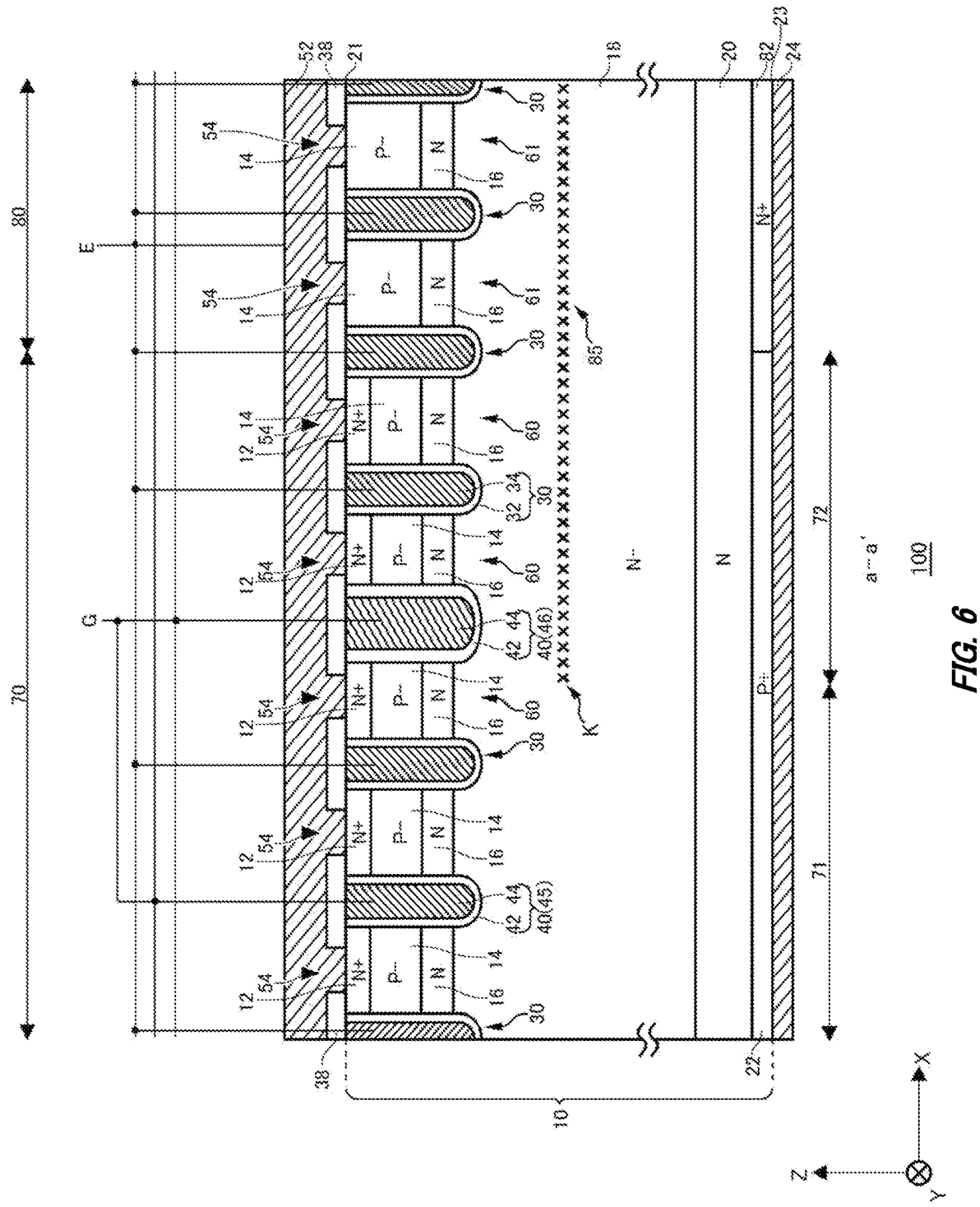
FIG. 6 is a diagram illustrating a partial cross section of the semiconductor device 100 according to Embodiment 3 and electrical connection thereof.

Embodiment 3 is a configuration example in which the related semiconductor device 100 includes one gate pad, and the OFF timings are matched. FIG. 6 is a diagram illustrating a partial cross section of the semiconductor device 100 according to Embodiment 3 and electrical connection thereof. As an example, the cross section illustrated in FIG. 6 corresponds to the a-a' cross section in FIG. 2.

The semiconductor device 100 of this example includes one gate pad G. The first gate trench portion 45 and the second gate trench portion 46 may be electrically connected through the gate pad G by the same gate runner, or may be electrically connected to the gate pad G through the different gate runners.

In this example, the first gate trench portion 45 has a cross-sectional area different from that of the second gate trench portion 46. In a case where there is a mention as a cross-sectional area of the trench portion in the present specification, it means an area in the XY cross section of each gate trench portion. In this example, the cross-sectional area of the second gate trench portion 46 is set larger than the cross-sectional area of the first gate trench portion 45. In other words, the second gate trench portion 46 with a larger cross-sectional area has a smaller resistance than the first gate trench portion 45 since the cross-sectional area of the gate conductive portion 44 is also large. With this configuration, the signal transmission from the gate pad G to the second gate trench portion 46 becomes faster than the signal transmission to the first gate trench portion 45, and the OFF timings can be matched.

Further, the thickness of the gate insulating film 42 may be equal in the first gate trench portion 45 and the second gate trench portion 46. In addition, the cross-sectional area of the dummy trench portion 30 disposed in the boundary region 72 may be not set large, that is, equal to the cross-sectional area of the first gate trench portion 45.

Alternatively, the gate conductive portion 44 in the first gate trench portion 45 may be formed of a material different from that of the gate conductive portion 44 in the second gate trench portion 46. As an example, the gate conductive portion 44 of the second gate trench portion 46 is formed of a material having a higher conductivity than the gate conductive portion 44 of the first gate trench portion 45. With this configuration, the signal transmission from the gate pad G to the second gate trench portion 46 becomes faster than the signal transmission to the first gate trench portion 45, and the OFF timings can be matched.

Embodiment 4

Figure 7:
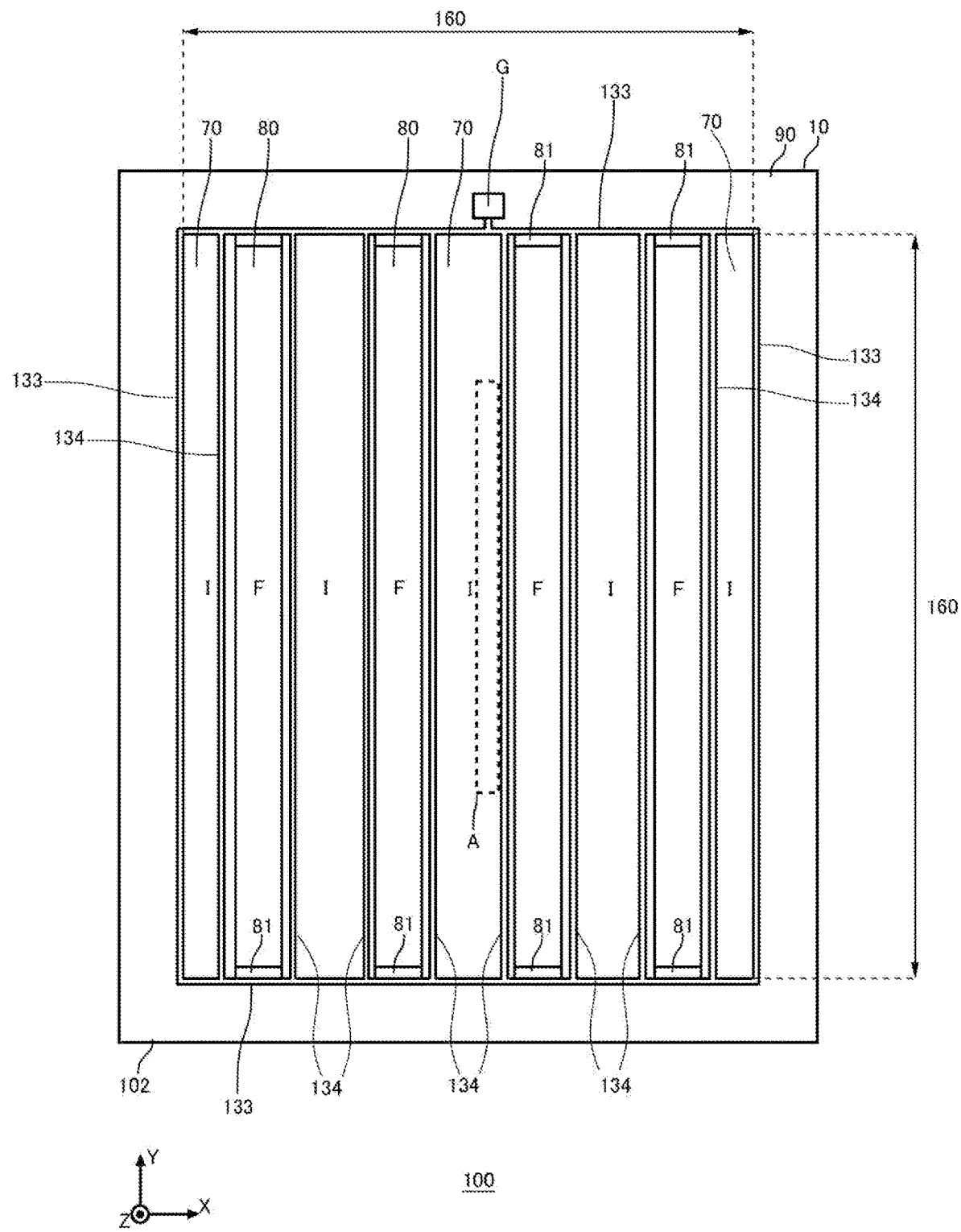
FIG. 7 is a diagram illustrating an upper surface of the semiconductor device 100 according to Embodiment 4.

Embodiment 4 is a configuration example in which the gate runner includes the outer peripheral gate runner and the inside gate runner described later. FIG. 7 is a diagram illustrating the upper surface of the semiconductor device 100 according to Embodiment 4. As an example, the semiconductor device 100 illustrated in FIG. 7 includes one gate pad G.

The semiconductor device 100 of this example includes an outer peripheral gate runner 133 which is disposed to surround the active region 160 when viewed from the upper surface, and electrically connected to the first gate trench portion 45 and the second gate trench portion 46. The outer peripheral gate runner 133 may have the same configuration as the first gate runner 131 or the second gate runner 132.

In addition, the semiconductor device 100 of this example further includes an inside gate runner 134 which extends inside the outer peripheral gate runner 133, and electrically connected to the outer peripheral gate runner 133. The inside gate runner 134 may be formed of a semiconductor such as polysilicon doped with impurities or metal mainly composed of aluminum such as an aluminum silicon alloy. The inside gate runner 134 may be formed of the same material as the outer peripheral gate runner 133.

The inside gate runner 134 of this example is provided to extend in the Y axis direction from one outer peripheral gate runner 133 in almost the center in the Y axis direction to the other outer peripheral gate runner 133 so as to vertically traverse the active region 160. The inside gate runner 134 of this example extends right above either one gate trench portion in the extension direction of the gate trench portion when viewed from the upper surface.

A plurality of the inside gate runners 134 may be provided. As an example, the inside gate runner 134 is disposed to extend right above a part or all of the second gate trench portions 46. In this case, the inside gate runner 134 is provided in the active region 160, so that the variation in the wiring length from the gate pad G can be reduced for each portion of the second gate trench portion 46.

Embodiment 4-1

Figure 8:
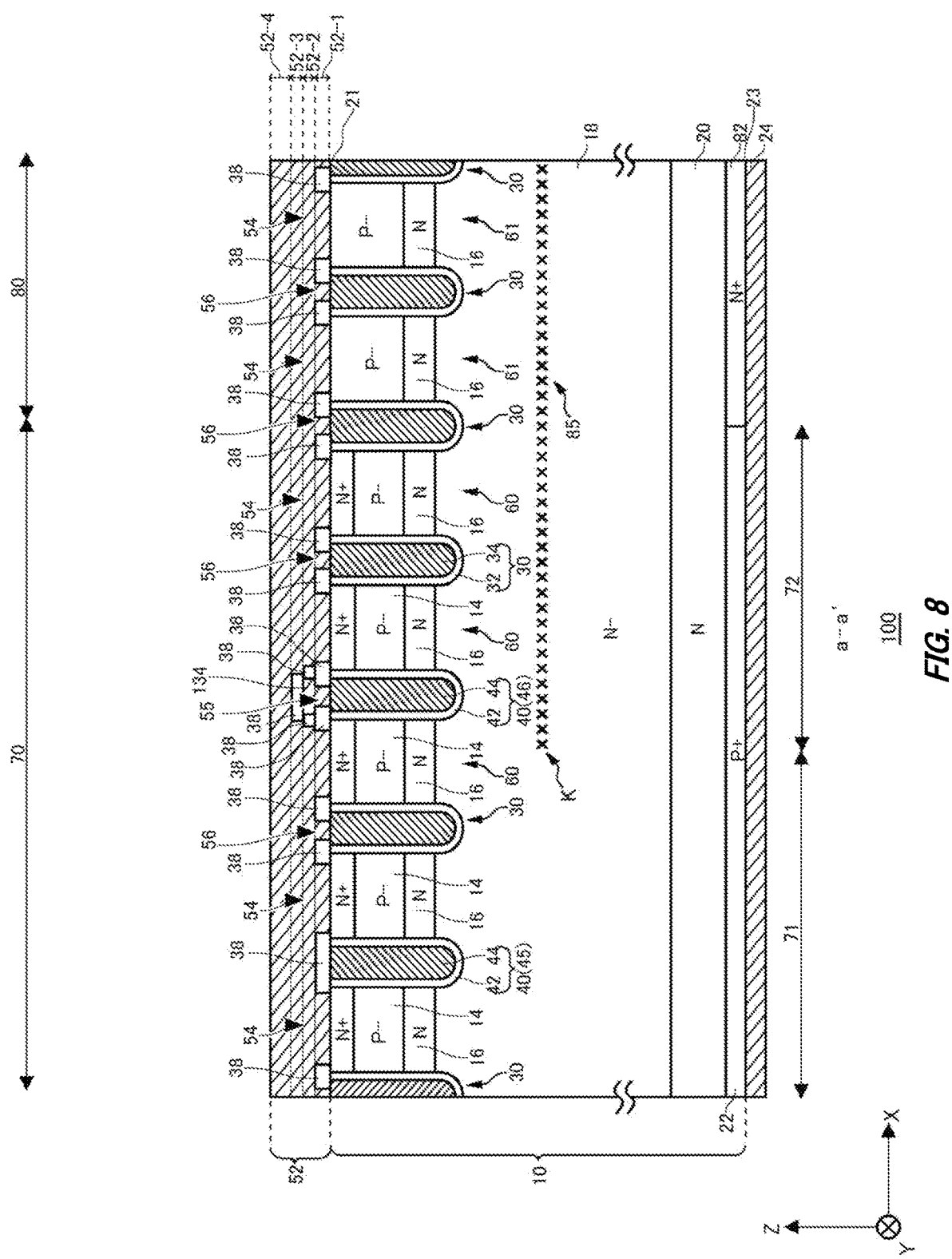
FIG. 8 is a diagram illustrating a partial cross section of the semiconductor device 100 according to Embodiment 4-1.

Embodiment 4-1 is an example of Embodiment 4, and is a configuration example in which the OFF timings are matched. FIG. 8 is a diagram illustrating a partial cross section of the semiconductor device 100 according to Embodiment 4-1. As an example, the cross section illustrated in FIG. 8 corresponds to the a-a' cross section in FIG. 2. FIG. 8 illustrates an example of the electrical connection in a case where the OFF timings are matched by the inside gate runner 134 of FIG. 7.

The emitter electrode 52 of this example includes a first layer 52-1, a second layer 52-2, the third layer 52-3, and a fourth layer 52-4. The first layer 52-1, the second layer 52-2, the third layer 52-3, and the fourth layer 52-4 are stacked sequentially from the upper surface 21 of the semiconductor substrate 10 in the +Z axis direction. As an example, the first layer 52-1 and the third layer 52-3 are via layers, and the second layer 52-2 and the fourth layer 52-4 are metal layers. The interlayer dielectric film 38 is disposed in the via layer, and separates the emitter electrode 52 and each trench portion. Further, the emitter electrode 52 in this example is connected to the dummy conductive portion 34 of the dummy trench portion 30 through the contact hole provided in the interlayer dielectric film 38. However, the emitter electrode 52 may be connected to the dummy conductive portion of the dummy trench portion 30 at the edge of the dummy trench portion 30 in the Y axis direction.

The inside gate runner 134 of this example is disposed in the second layer 52-2. The inside gate runner 134 is separated from the emitter electrode 52 by the interlayer dielectric films 38 provided in the second layer 52-2 and the third layer 52-3.

As an example, the inside gate runner 134 extends right above the second gate trench portion 46, and is electrically connected to the second gate trench portion 46. The inside gate runner 134 is connected to the gate conductive portion 44 of the gate trench portion 40 through a contact hole 55 provided in the first layer 52-1. In other words, the inside gate runner 134 may be a part of the second layer 52-2, and the contact hole 55 may be a part of the first layer 52-1. In this way, since the inside gate runner 134 is wired at a close distance to each of the second gate trench portions 46, the signal transmission from the gate pad G to the second gate trench portion 46 becomes faster than the signal transmission to the first gate trench portion 45, and the OFF timings can be matched.

Further, FIG. 8 illustrates a configuration example of the inside gate runner 134 to match the OFF timings, but the ON timings can be matched by modifying the configuration as below. For example, unlike FIG. 8, the inside gate runner 134 extends right above the first gate trench portion 45, and is electrically connected to the first gate trench portion 45. With this configuration, the signal transmission from the gate pad G to the second gate trench portion 46 is slower than the signal transmission to the first gate trench portion 45, and the ON timings can be matched.

Embodiment 4-2

Figure 9:
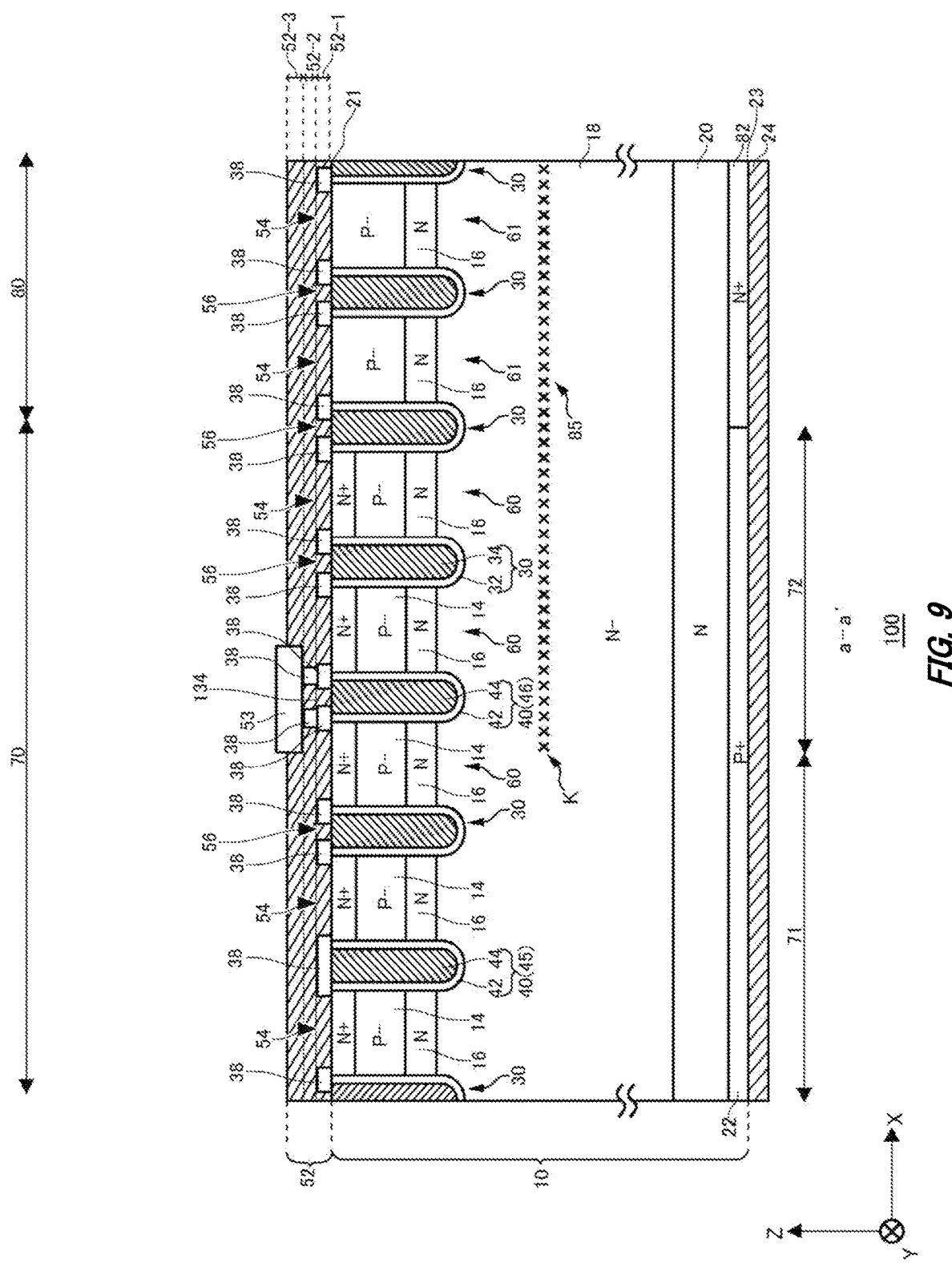
FIG. 9 is a diagram illustrating a partial cross section of the semiconductor device 100 according to Embodiment 4-2.

Embodiment 4-2 is an example of Embodiment 4, and is a configuration example to match the OFF timings. FIG. 9 is a diagram illustrating a partial cross section of the semiconductor device 100 according to Embodiment 4-2. Similarly to FIG. 8, FIG. 9 illustrates another example of the electrical connection in a case where the inside gate runner 134 extends right above the second gate trench portion 46 in the extension direction of the second gate trench portion 46, and the OFF timings are matched. Hereinbelow, the description will be mainly given about the differences from FIG. 8.

The emitter electrode 52 of this example includes the first layer 52-1, the second layer 52-2, and the third layer 52-3. The first layer 52-1, the second layer 52-2, and the third layer 52-3 are stacked sequentially from the upper surface 21 of the semiconductor substrate 10 in the +Z axis direction. As an example, the first layer 52-1 is a via layer, and the second layer 52-2 and the third layer 52-3 are metal layers. The interlayer dielectric film 38 is disposed in the via layer, and separates the emitter electrode 52 and each trench portion. However, the emitter electrode 52 is connected to the dummy conductive portion 34 of the dummy trench portion 30 through the contact hole provided in the interlayer dielectric film 38. The third layer 52-3 may be formed of nickel plating or the like.

The inside gate runner 134 of this example is disposed in the second layer 52-2. The inside gate runner 134 is covered by the interlayer dielectric film 38 provided in the second layer 52-2 and a surface protection layer 53 provided in the third layer 52-3, and separated from the emitter electrode 52. The surface protection layer 53 is disposed above the inside gate runner 134. The surface protection layer 53 may be exposed from the third layer 52-3, and may be a passivation film formed of polyimide or the like. The third layer 52-3 may be bonded to a lead frame by soldering or the like so as to be connected to an external circuit. Further, without forming the third layer 52-3, the second layer 52-2 may be bonded to a wire by ultrasonic bonding so as to be connected to an external circuit.

Embodiment 5

Figure 10A:
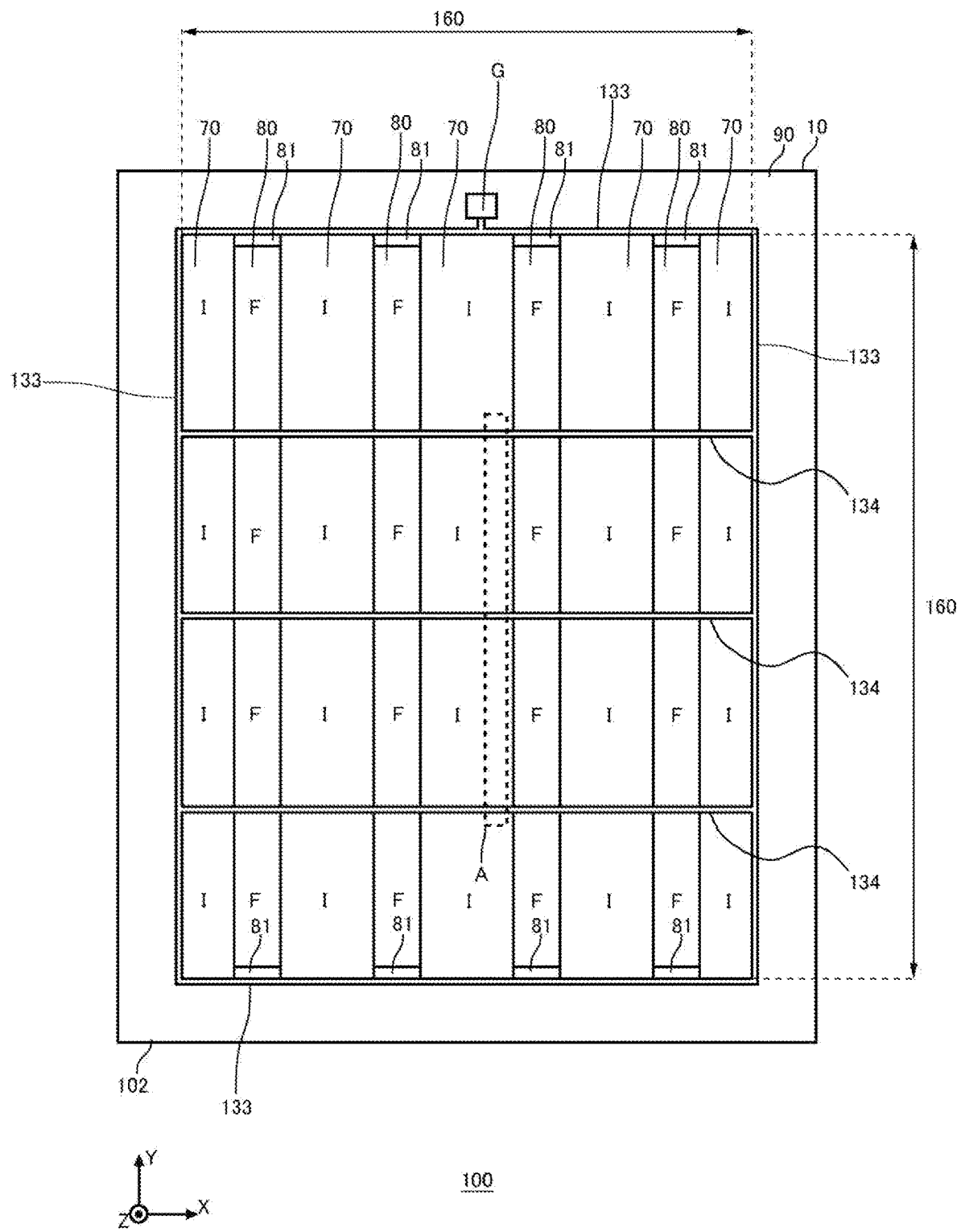
FIG. 10A is a diagram illustrating an upper surface of the semiconductor device 100 according to Embodiment 5.

Embodiment 5 is a modification of Embodiment 4. FIG. 10A is a diagram illustrating the upper surface of the semiconductor device 100 according to Embodiment 5. Similarly to FIG. 7, the semiconductor device 100 illustrated in FIG. 10A includes the outer peripheral gate runner 133 and the inside gate runner 134. Hereinbelow, the description will be mainly given about the differences from FIG. 7.

The inside gate runner 134 of this example is provided to extend in the Y axis direction from one outer peripheral gate runner 133 in almost the center in the X axis direction to the other outer peripheral gate runner 133 so as to horizontally traverse the active region 160. The extension direction of the inside gate runner 134 of this example is crossed with the extension direction of the gate trench portion 40 when viewed from the upper surface. A plurality of the inside gate runners 134 may be provided. Further, in FIG. 10A, three inside gate runners 134 are provided, but the number of the inside gate runners 134 are not limited thereto.

In a case where the active region 160 is divided by the inside gate runner 134, the transistor portion 70 and the diode portion 80 may be alternately disposed in the X axis direction in each divided region.

Embodiment 5-1

Figure 10B:
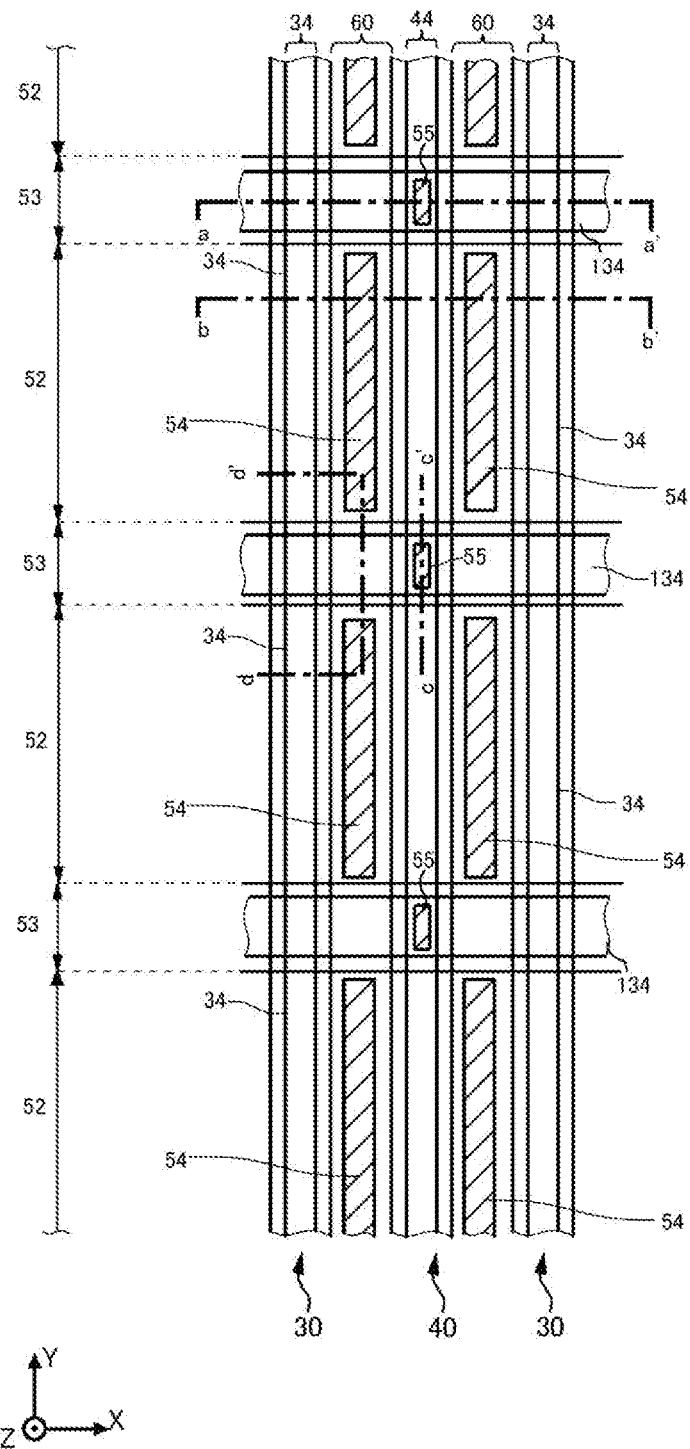
FIG. 10B is a diagram illustrating a partial upper surface of the semiconductor device 100 according to Embodiment 5-1.
Figure 10C:
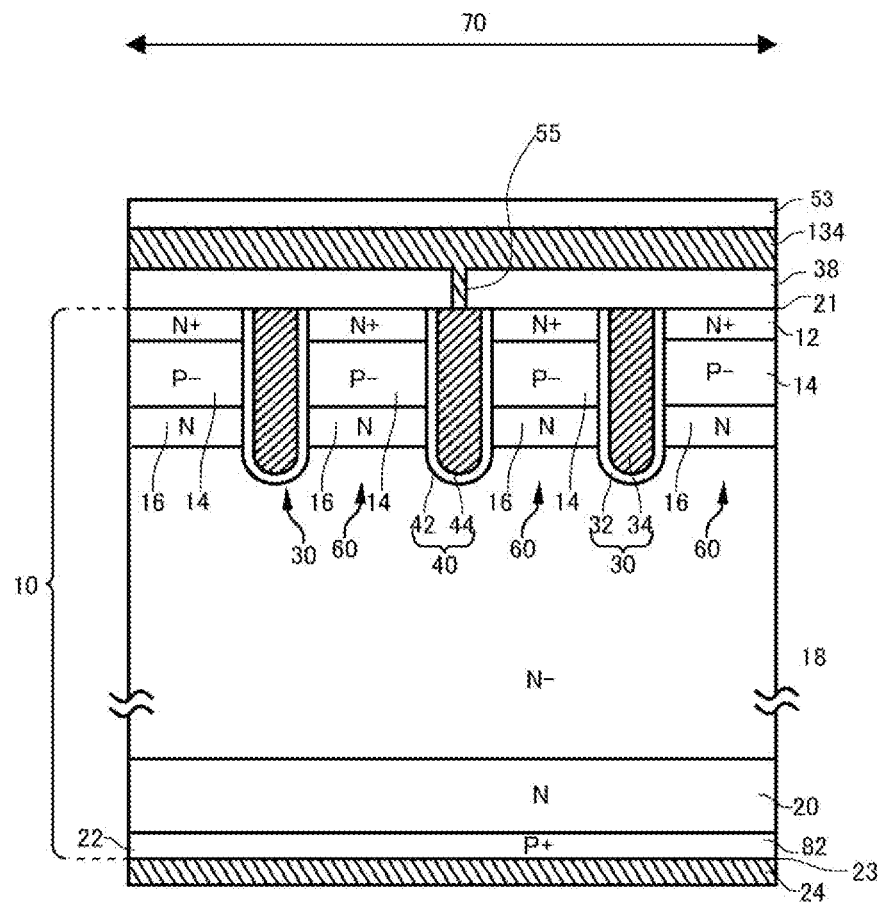
FIG. 10C is a diagram illustrating a partial cross section of the semiconductor device 100 according to Embodiment 5-1.
Figure 10D:
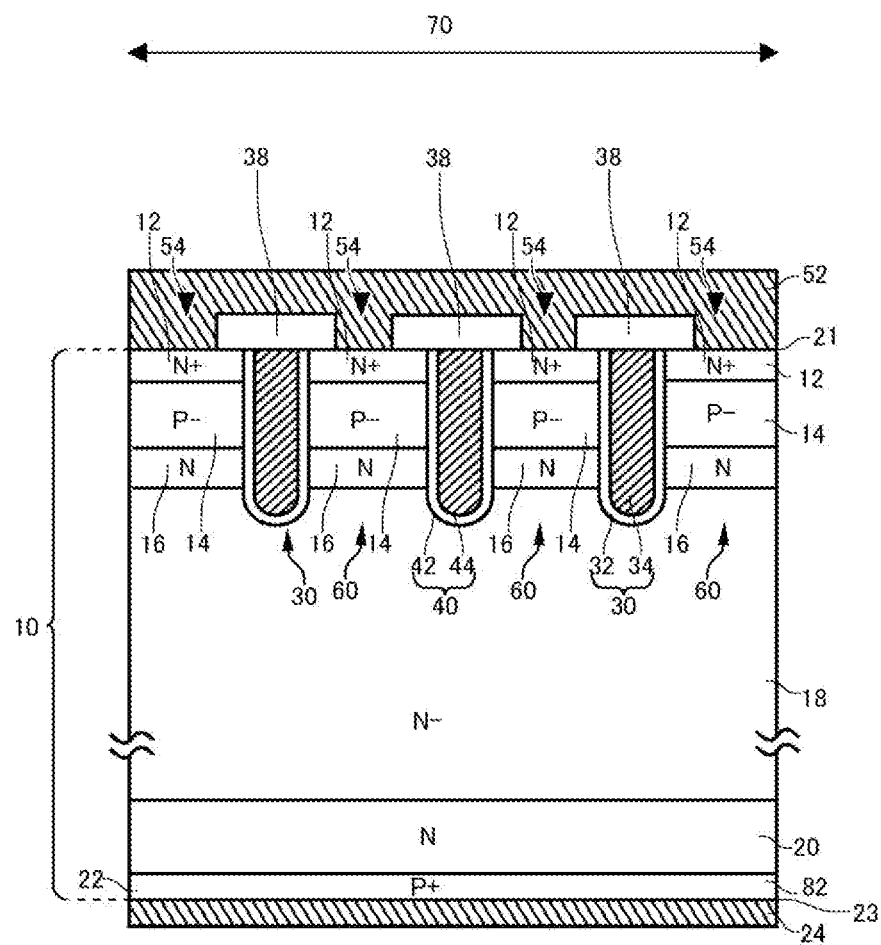
FIG. 10D is a diagram illustrating a partial cross section of the semiconductor device 100 according to Embodiment 5-1.
Figure 10D:
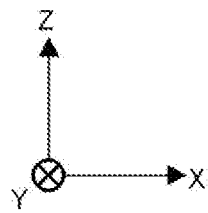
Figure 10E:
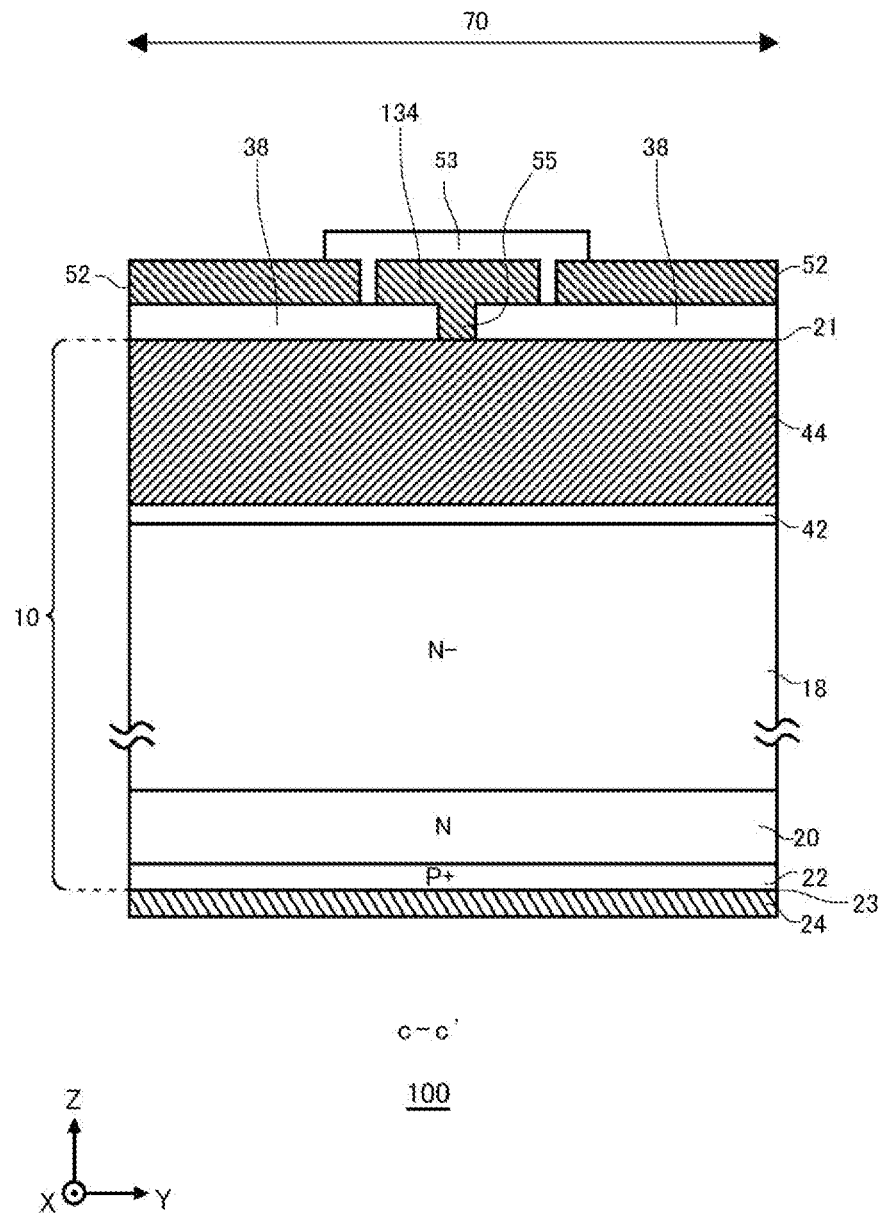
FIG. 10E is a diagram illustrating a partial cross section of the semiconductor device 100 according to Embodiment 5-1.
Figure 10F:
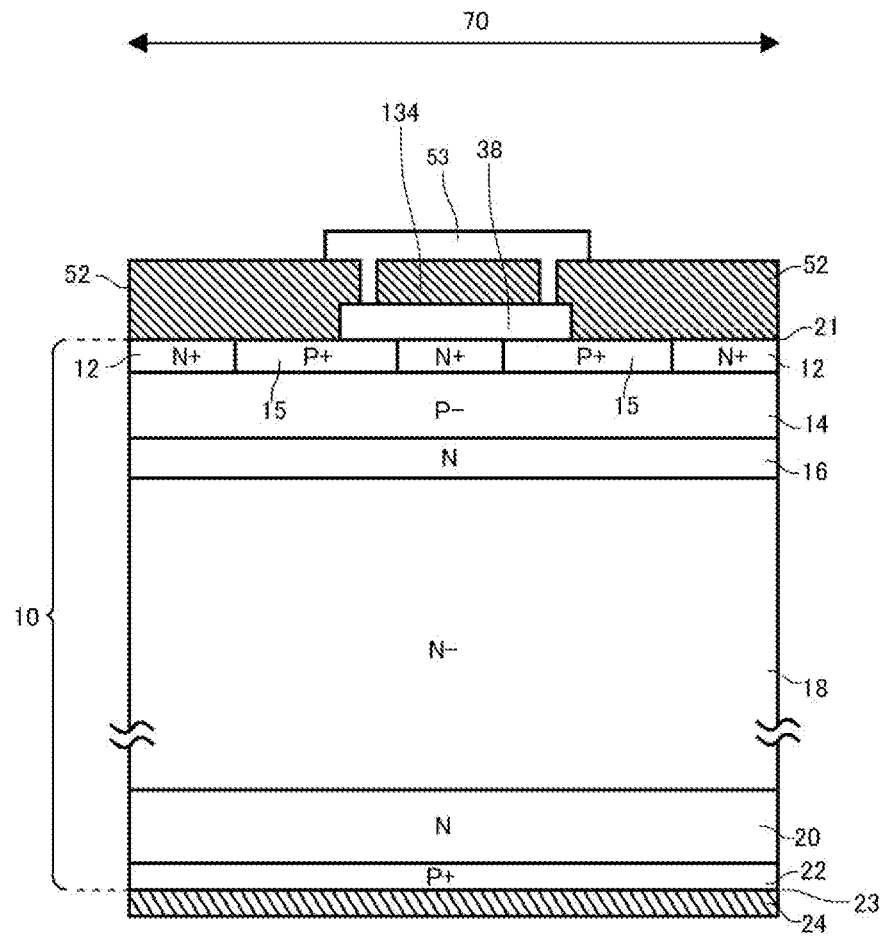
FIG. 10F is a diagram illustrating a partial cross section of the semiconductor device 100 according to Embodiment 5-1.

Embodiment 5-1 is an example of Embodiment 5. FIG. 10B is a diagram illustrating a partial upper surface of the semiconductor device 100 according to Embodiment 5-1. As an example, FIG. 10B corresponds to an enlarged view of Region A in FIG. 10A. The inside gate runner 134 of this example is covered by the surface protection layer 53, and the surface protection layer 53 is exposed from the emitter electrode 52. For the convenience of explanation, the emitter electrode 52 and the surface protection layer 53 are omitted. The inside gate runner 134 is connected to either one gate conductive portion 44 of the first gate trench portion 45 and the second gate trench portion 46 through the contact hole 55.

For example, in a case where the contact hole 55 is provided between the inside gate runner 134 and the second gate trench portion 46, the electrical connection is formed right above the second gate trench portion 46. Therefore, the signal transmission from the gate pad G to the second gate trench portion 46 becomes faster than the signal transmission to the first gate trench portion 45, and the OFF timings can be matched. Alternatively, in a case where the contact hole 55 is provided between the inside gate runner 134 and the first gate trench portion 45, the electrical connection is formed right above the first gate trench portion 45. Therefore, the signal transmission from the gate pad G to the second gate trench portion 46 becomes slower than the signal transmission to the first gate trench portion 45, and the ON timings can be matched. In addition, in this example, the number of inside gate runners 134 and the interval between the inside gate runners 134 can be appropriately set, thereby improving the degree of freedom of the design. In addition, in this example, since it is sufficient to provide the contact hole 55 only at the point where the inside gate runner 134 and the second gate trench portion 46 are crossed, the processing may be not complicated.

FIGS. 10C to 10F are diagrams illustrating a partial cross section of the semiconductor device 100 according to Embodiment 5-1. Specifically, FIG. 10C corresponds to the a-a' cross section in FIG. 10B, FIG. 10D corresponds to the b-b' cross section in FIG. 10B, FIG. 10E corresponds to the c-c' cross section in FIG. 10B, and FIG. 10F corresponds to the d-d' cross section in FIG. 10B. Similarly to FIG. 9, the emitter electrode 52 has a layer structure composed of a metal layer and a via layer, but is illustrated simply as the emitter electrode 52. The inside gate runner 134 may be a part of the metal layer (for example, the second layer 52-2 of FIG. 9) of the emitter electrode 52. Further, while the extension direction of the inside gate runner 134 has been described about a case where the extension direction is orthogonal to the extension direction of the gate trench portion 40 when viewed from the upper surface, the invention is not limited thereto, and the extension direction may be crossed with an any angle.

Embodiment 5-2

Figure 11A:
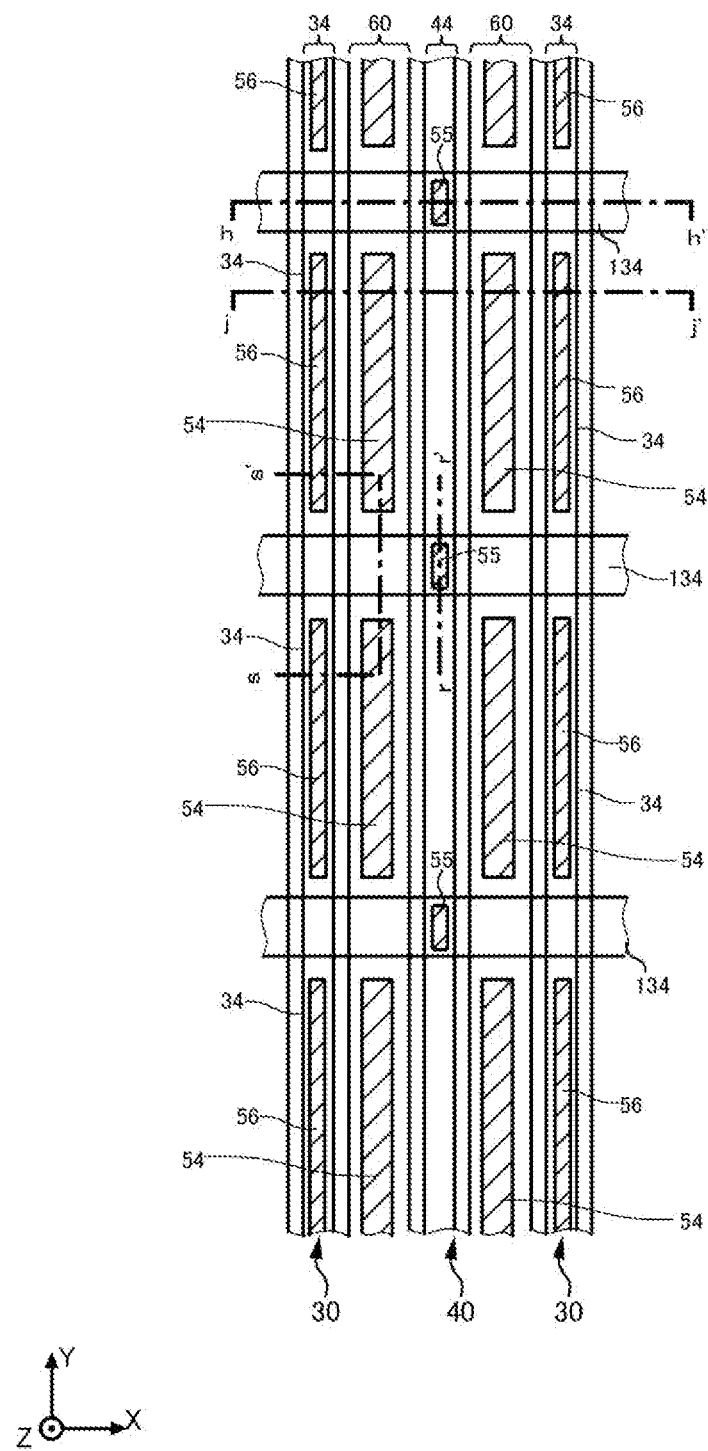
FIG. 11A is a diagram illustrating a partial upper surface of the semiconductor device 100 according to Embodiment 5-2.
Figure 11B:
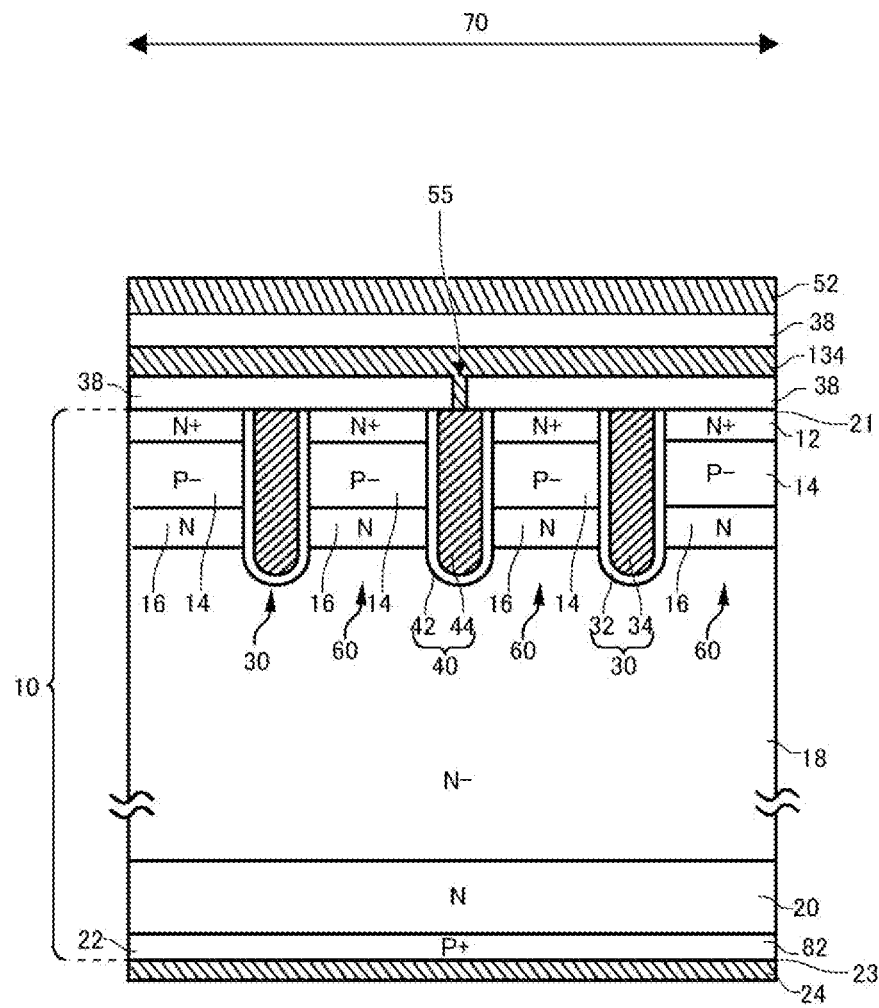
FIG. 11B is a diagram illustrating a partial cross section of the semiconductor device 100 according to Embodiment 5-2.
Figure 11B:
Figure 11C:
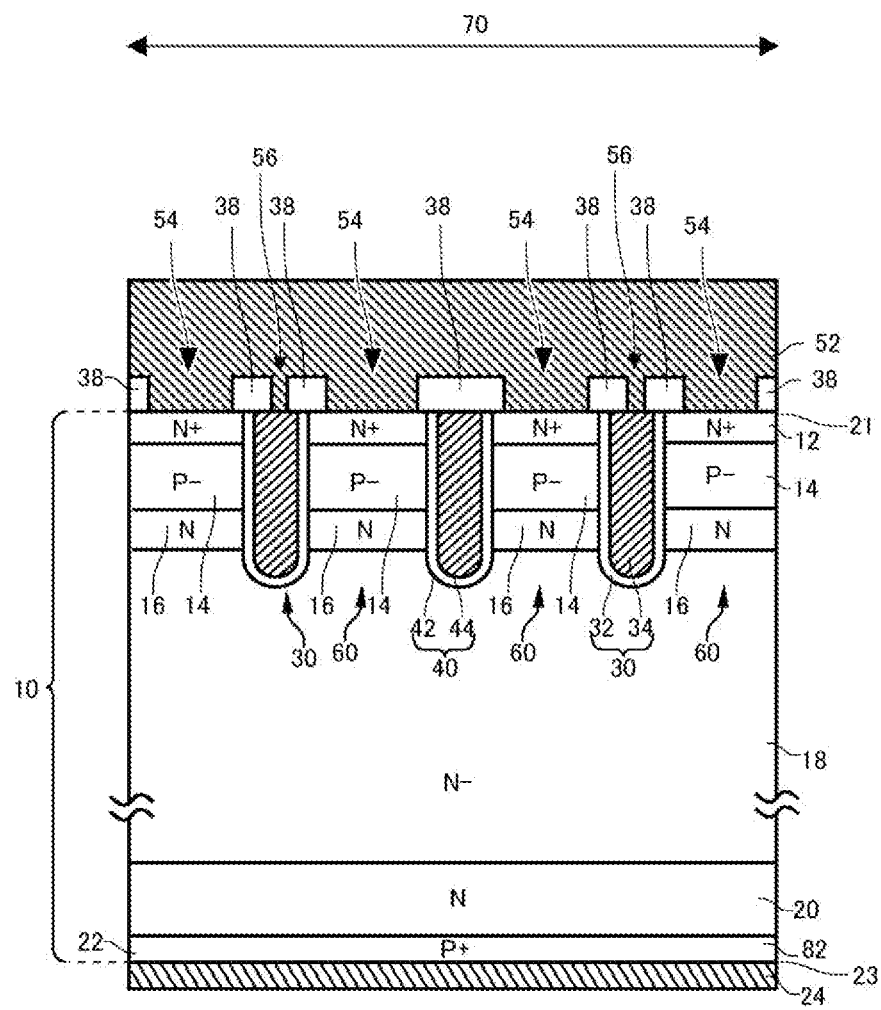
FIG. 11C is a diagram illustrating a partial cross section of the semiconductor device 100 according to Embodiment 5-2.
Figure 11D:
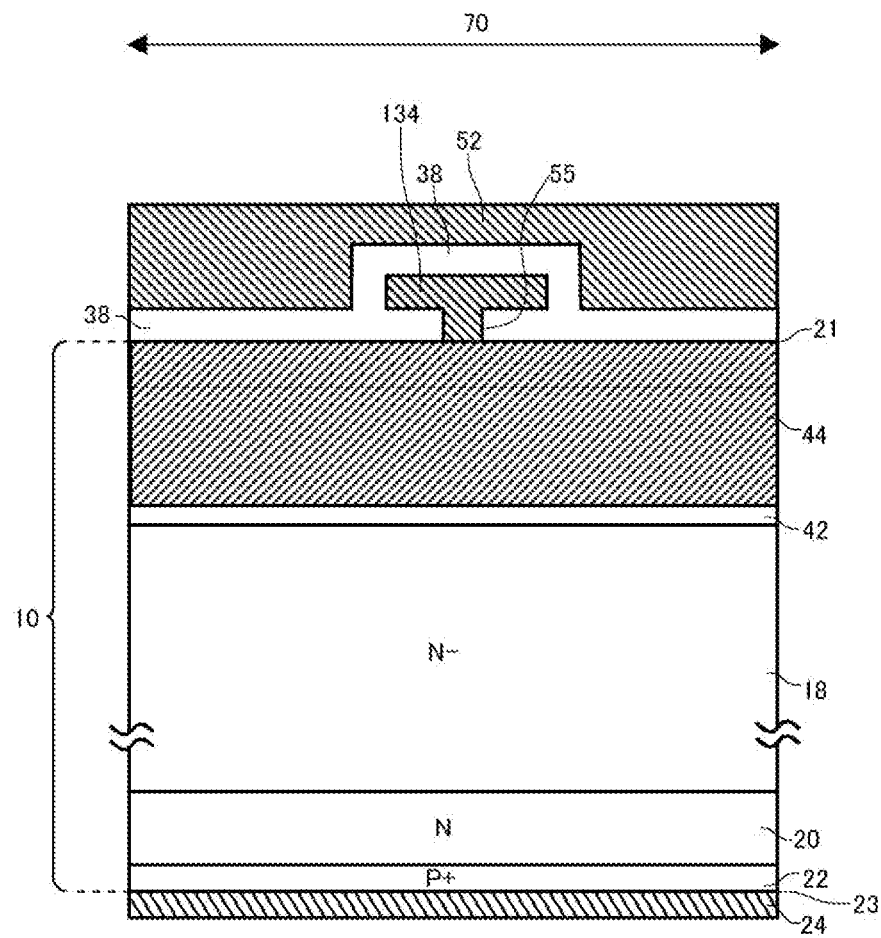
FIG. 11D is a diagram illustrating a partial cross section of the semiconductor device 100 according to Embodiment 5-2.
Figure 11E:
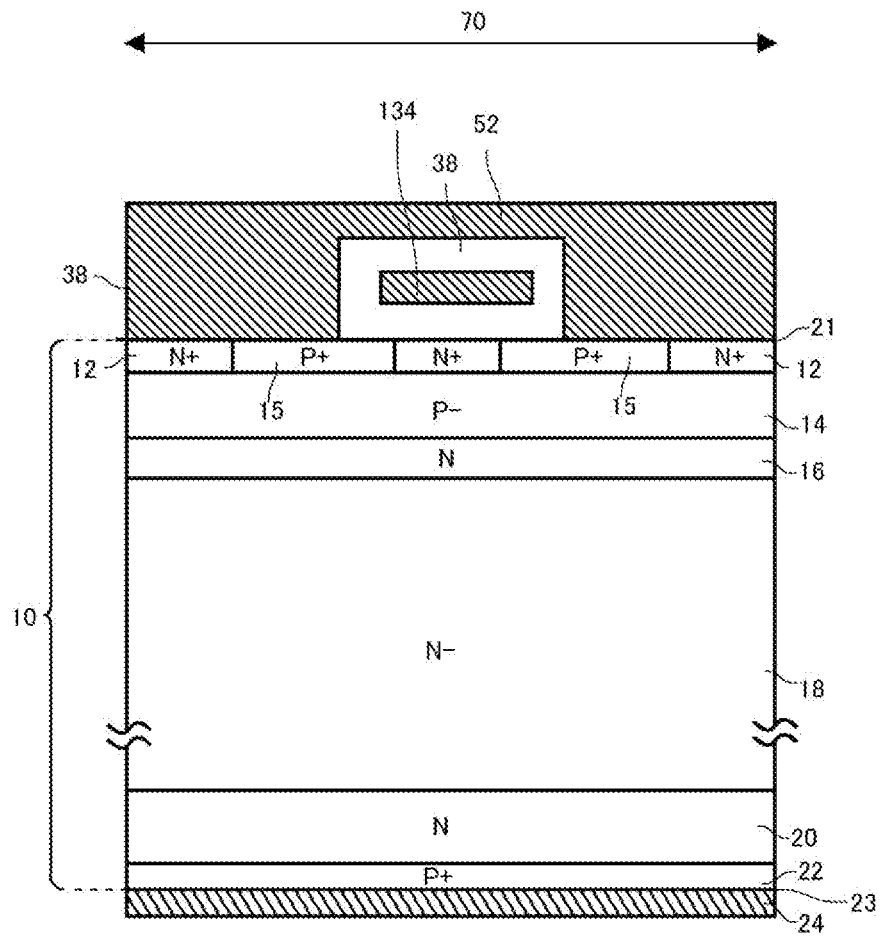
FIG. 11E is a diagram illustrating a partial cross section of the semiconductor device 100 according to Embodiment 5-2.
Figure 11E:
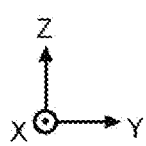

Embodiment 5-2 is another example of Embodiment 5. FIG. 11A is a diagram illustrating a partial upper surface of the semiconductor device 100 according to Embodiment 5-2. As an example, FIG. 11A corresponds to an enlarged view of Region A in FIG. 10A. The inside gate runner 134 of this example is connected to either one gate conductive portion 44 of the first gate trench portion 45 and the second gate trench portion 46 through the contact hole 55. The inside gate runner 134 of this example is disposed in the emitter electrode 52, but the emitter electrode 52 is omitted for the convenience of explanation.

FIGS. 11B to 11E are diagrams illustrating a partial cross section of the semiconductor device 100 according to Embodiment 5-2. Specifically, FIG. 11B corresponds to the h-h' cross section in FIG. 11A, FIG. 11C corresponds to the j-j' cross section in FIG. 11A, FIG. 11D corresponds to the r-r' cross section in FIG. 11A, and FIG. 11E corresponds to the s-s' cross section in FIG. 11A. Similarly to FIG. 8, the emitter electrode 52 has a layer structure composed of a metal layer and a via layer, but is illustrated simply as the emitter electrode 52. The inside gate runner 134 may be a part of the metal layer (for example, the second layer 52-2 of FIG. 8) of the emitter electrode 52.

Embodiment 5-3

Figure 12A:
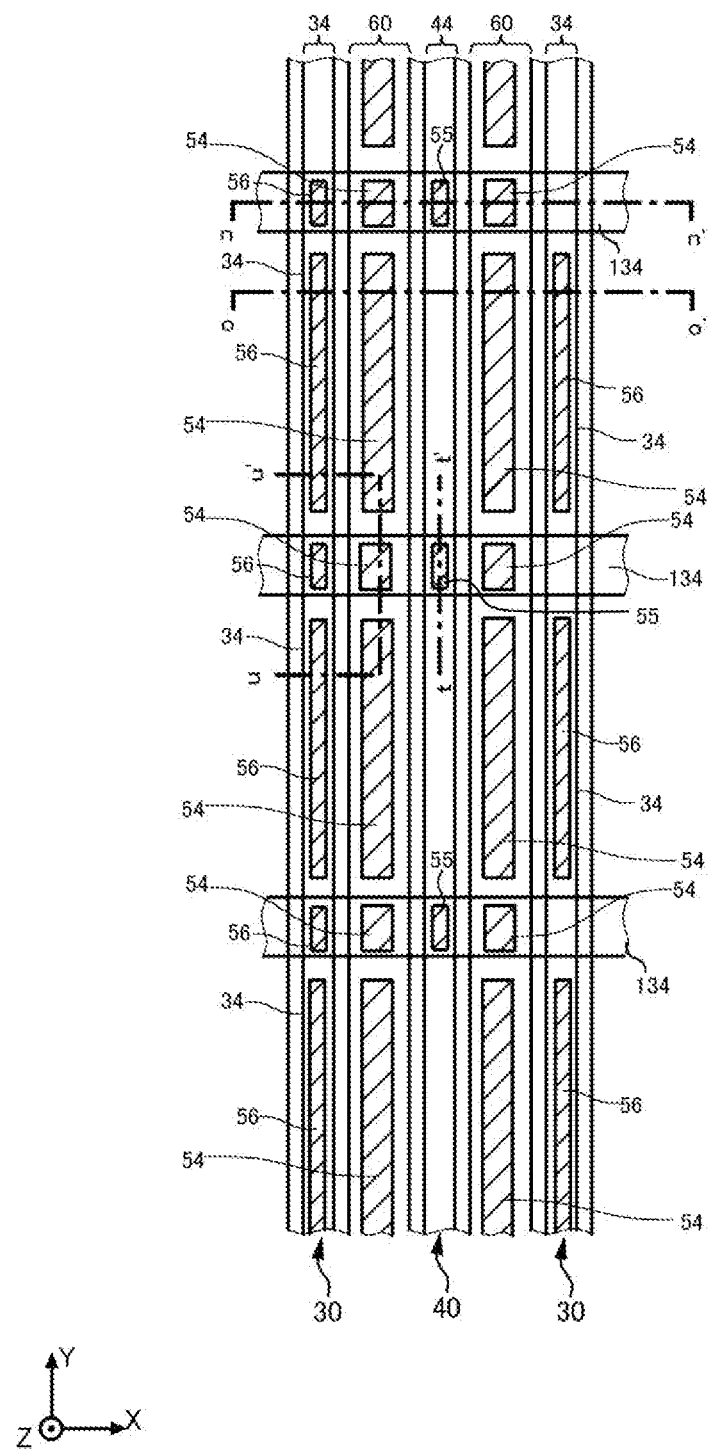
FIG. 12A is a diagram illustrating a partial upper surface of the semiconductor device 100 according to Embodiment 5-3.
Figure 12B:
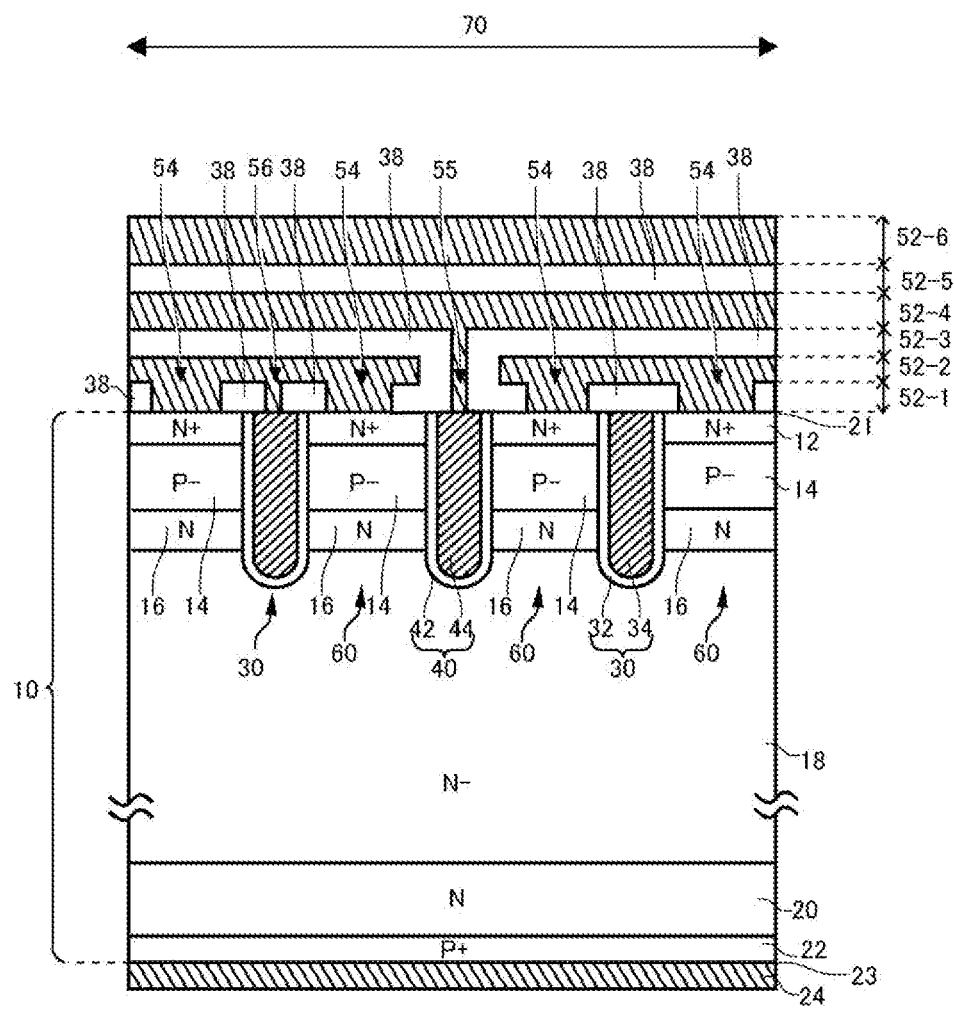
FIG. 12B is a diagram illustrating a partial cross section of the semiconductor device 100 according to Embodiment 5-3.
Figure 12B:
Figure 12C:
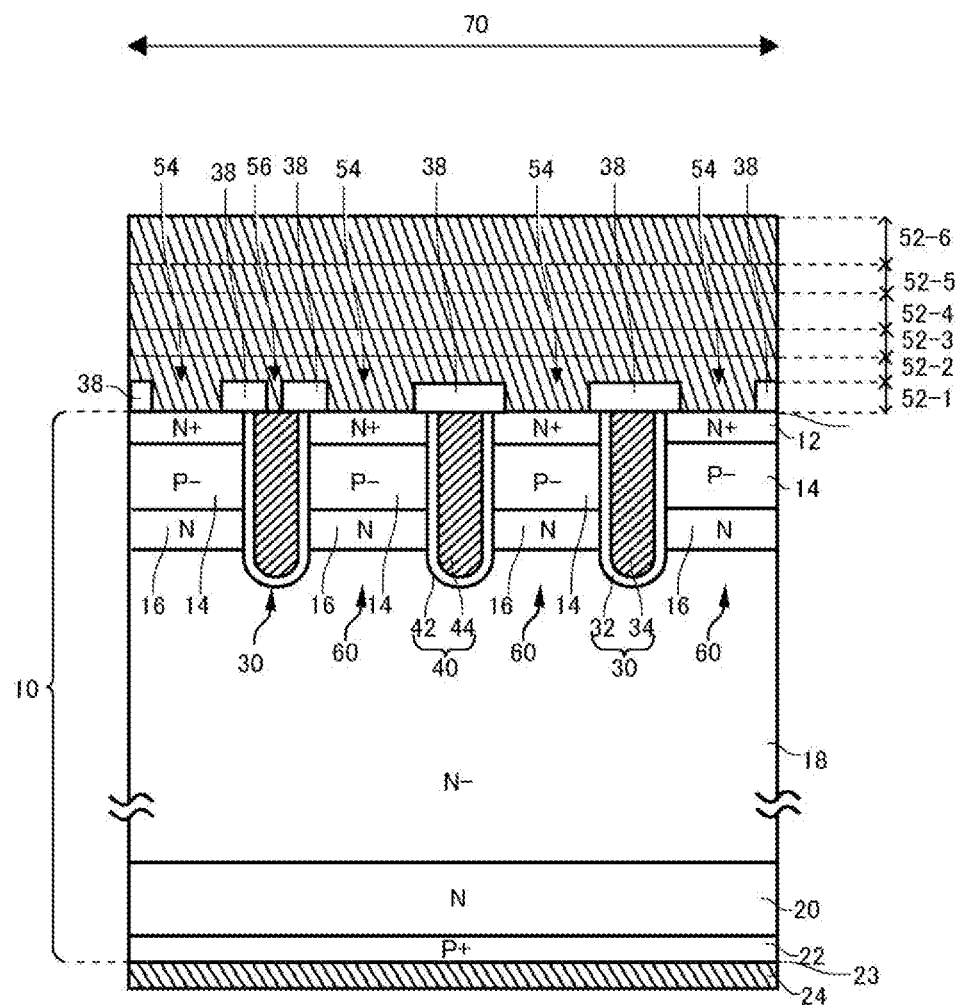
FIG. 12C is a diagram illustrating a partial cross section of the semiconductor device 100 according to Embodiment 5-3.
Figure 12D:
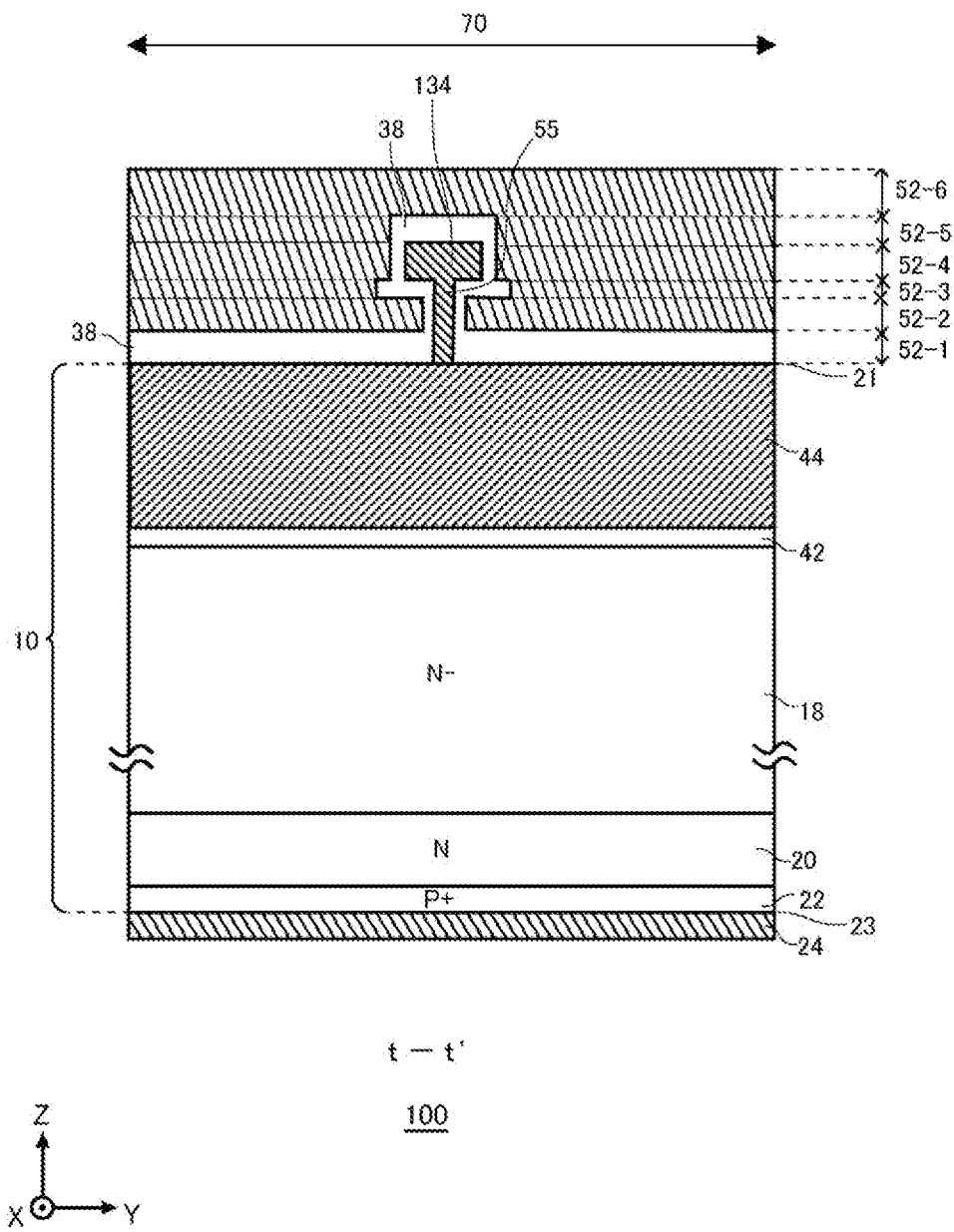
FIG. 12D is a diagram illustrating a partial cross section of the semiconductor device 100 according to Embodiment 5-3.
Figure 12E:
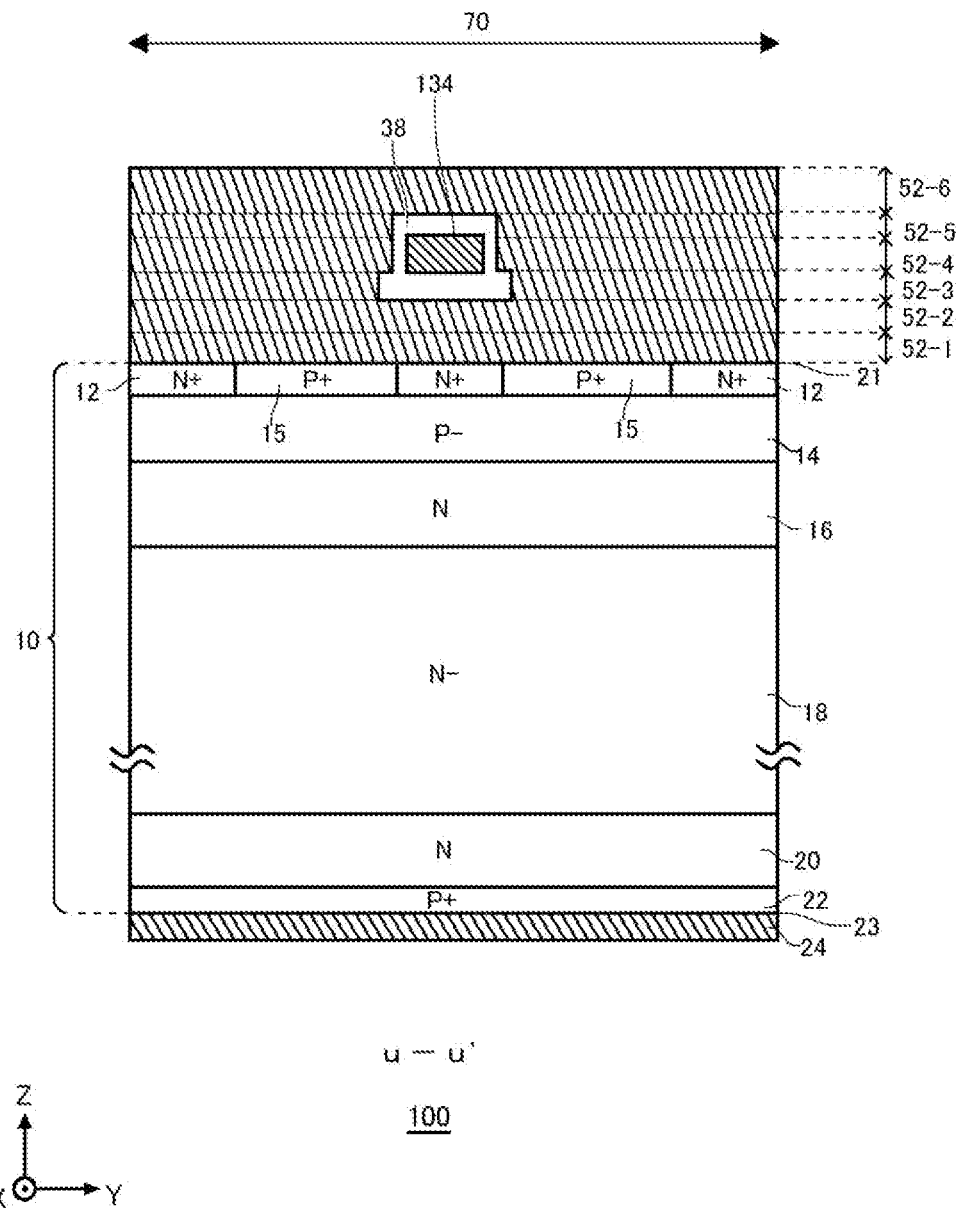
FIG. 12E is a diagram illustrating a partial cross section of the semiconductor device 100 according to Embodiment 5-3.
Figure 13A:
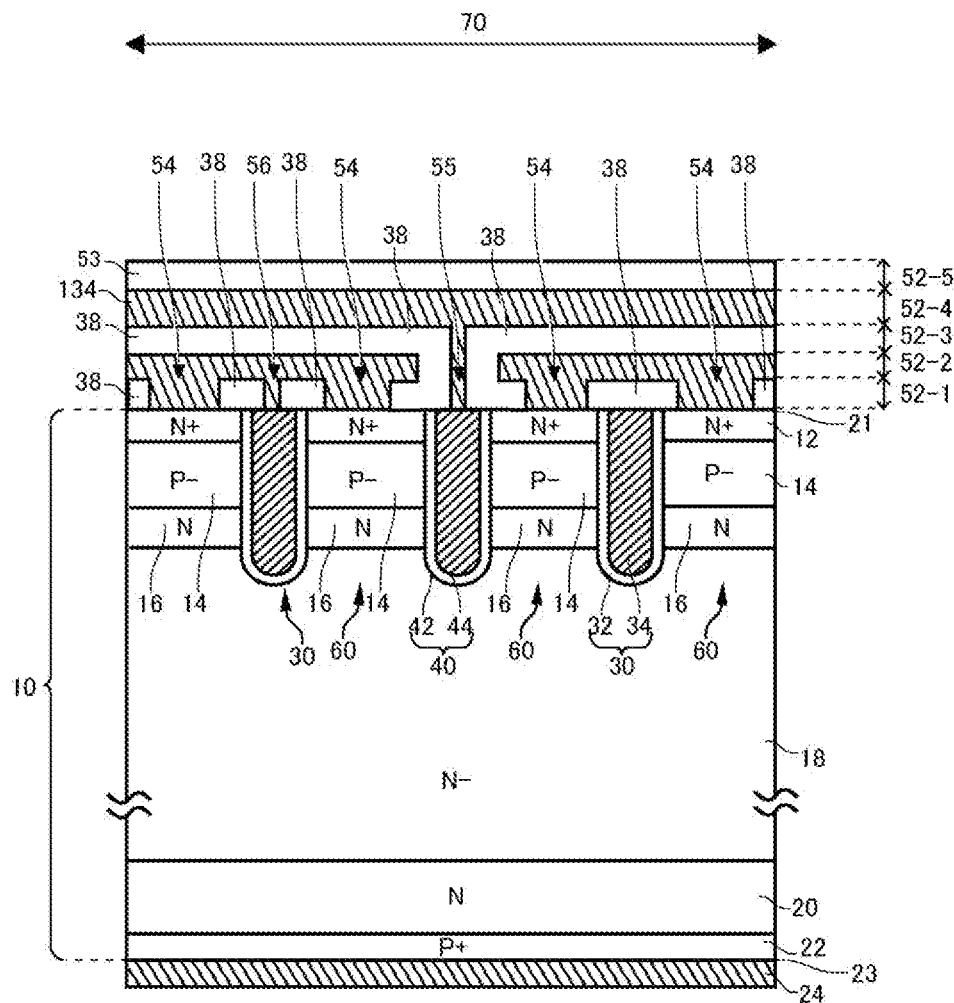
FIG. 13A is a diagram illustrating a partial cross section of the semiconductor device 100 according to Embodiment 5-4.
Figure 13B:
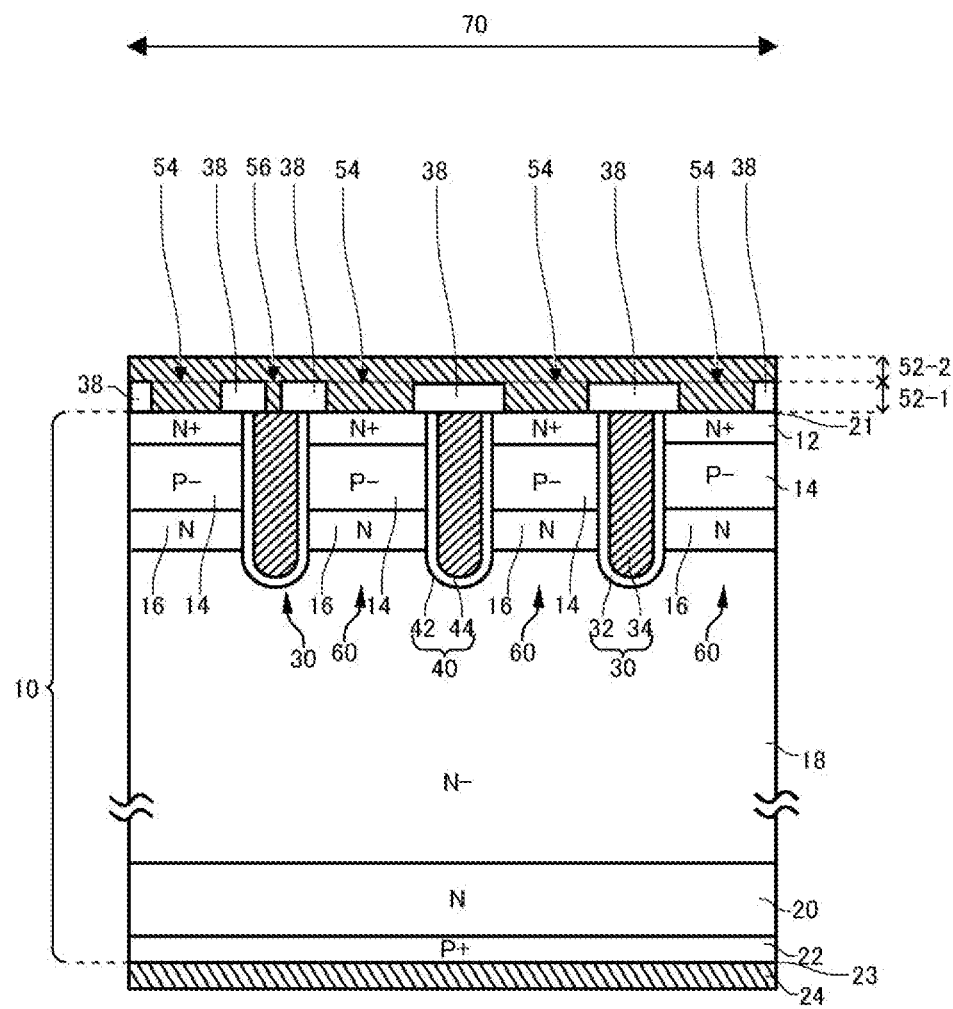
FIG. 13B is a diagram illustrating a partial cross section of the semiconductor device 100 according to Embodiment 5-4.
Figure 13C:
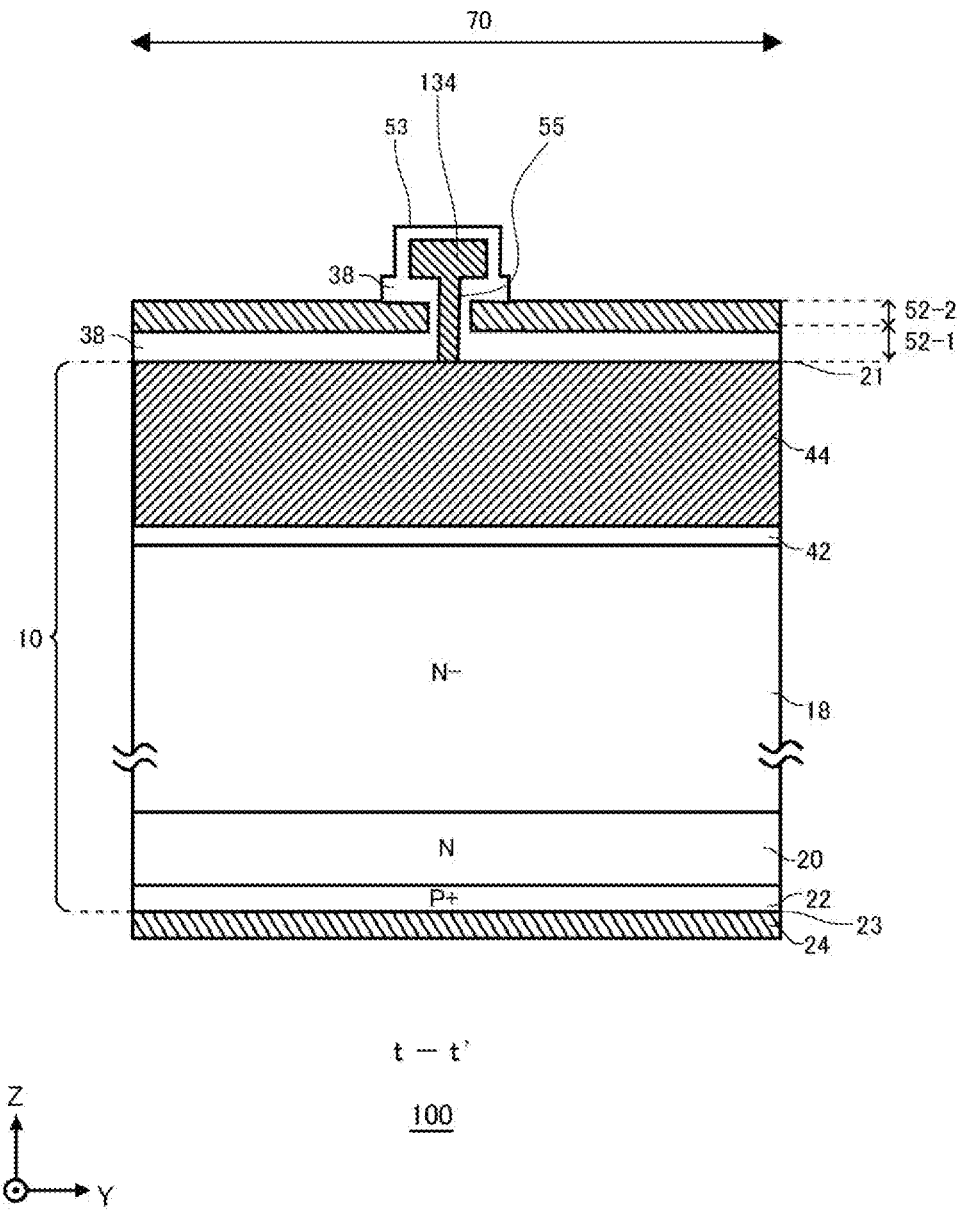
FIG. 13C is a diagram illustrating a partial cross section of the semiconductor device 100 according to Embodiment 5-4.
Figure 13D:
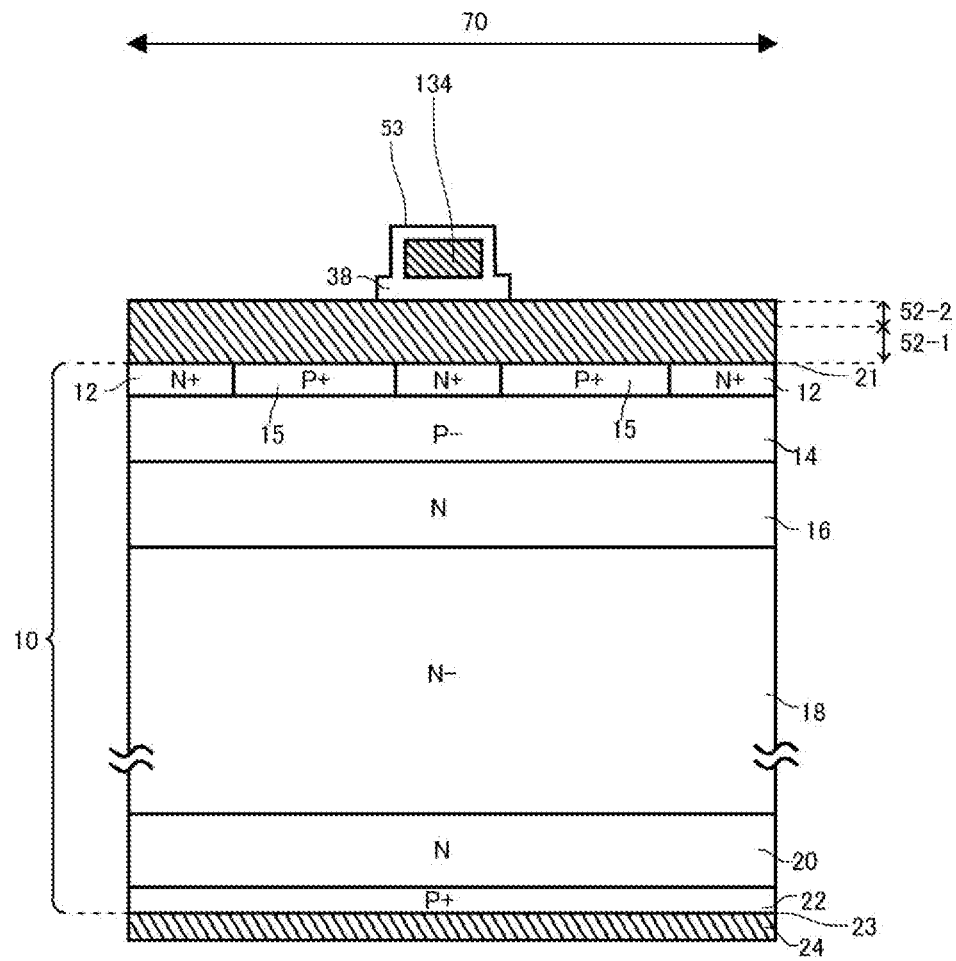
FIG. 13D is a diagram illustrating a partial cross section of the semiconductor device 100 according to Embodiment 5-4.
Figure 13D:

Embodiment 5-3 is another example of Embodiment 5. FIG. 12A is a diagram illustrating a partial upper surface of the semiconductor device 100 according to Embodiment 5-3. As an example, FIG. 12A corresponds to an enlarged view of Region A in FIG. 10A. The inside gate runner 134 of this example is connected to either one gate conductive portion 44 of the first gate trench portion 45 and the second gate trench portion 46 through the contact hole 55. In addition, in this example, the dummy conductive portion 34 of the dummy trench portion 30 and the mesa portion 60 are also connected to the emitter electrode 52 through the contact holes 54 and 56 below the inside gate runner 134. The inside gate runner 134 of this example is disposed in the emitter electrode 52, but the emitter electrode 52 is omitted for the convenience of explanation.

FIGS. 12B to 12E are diagrams illustrating a partial cross section of the semiconductor device 100 according to Embodiment 5-3. Specifically, FIG. 12B corresponds to the n-n' cross section in FIG. 12A, FIG. 12C corresponds to the o-o' cross section in FIG. 12A, FIG. 12D corresponds to the t-t' cross section in FIG. 12A, and FIG. 12E corresponds to the u-u' cross section in FIG. 12A.

The emitter electrode 52 of this example includes the first layer 52-1, the second layer 52-2, the third layer 52-3, the fourth layer 52-4, a fifth layer 52-5, and a sixth layer 52-6. The first layer 52-1, the second layer 52-2, the third layer 52-3, the fourth layer 52-4, the fifth layer 52-5, and the sixth layer 52-6 are stacked sequentially from the upper surface 21 of the semiconductor substrate 10 in the +Z axis direction. As an example, the first layer 52-1, the third layer 52-3, and the fifth layer 52-5 are via layers, and the second layer 52-2, the fourth layer 52-4, and the sixth layer 52-6 are metal layers.

The interlayer dielectric film 38 is disposed in the via layer, and separates the emitter electrode 52 and each trench portion. However, the emitter electrode 52 (the second layer 52-2 of this example) is connected to the mesa portion 60 and the dummy conductive portion 34 of at least a part of the dummy trench portion 30 through the contact hole 56 provided in the interlayer dielectric film 38.

The inside gate runner 134 of this example is disposed in the fourth layer 52-4. The inside gate runner 134 is separated from the emitter electrode 52 by the interlayer dielectric films 38. In this way, in this example, also below the inside gate runner 134, the electrical connection between the emitter electrode 52 and the mesa portion 60 and the dummy trench portion 30 is formed, and an invalid region in the active region 160 is reduced.

Embodiment 5-4

Embodiment 5-4 is another example of Embodiment 5. FIGS. 13A to 13D are diagrams illustrating a partial cross section of the semiconductor device 100 according to Embodiment 5-4. Specifically, FIG. 13A corresponds to the n-n' cross section in FIG. 12A, FIG. 13B corresponds to the o-o' cross section in FIG. 12A, FIG. 13C corresponds to the t-t' cross section in FIG. 12A, and FIG. 13D corresponds to the u-u' cross section in FIG. 12A. The diagram illustrating the upper surface of the semiconductor device 100 of this example is omitted for common with FIG. 12A. However, the inside gate runner 134 of this example is different from the example described with reference to FIGS. 12A to 12E, and is disposed above the emitter electrode 52. Further, the emitter electrode 52 is omitted for the convenience of explanation.

The emitter electrode 52 of this example includes the first layer 52-1 and the second layer 52-2. The first layer 52-1 and the second layer 52-2 are stacked sequentially from the upper surface 21 of the semiconductor substrate 10 in the +Z axis direction. As an example, the first layer 52-1 is a via layer, and the second layer 52-2 is a metal layer.

The interlayer dielectric film 38 is disposed in the via layer, and separates the emitter electrode 52 and each trench portion. However, the emitter electrode 52 (the second layer 52-2 of this example) is connected to the mesa portion 60 and the dummy conductive portion 34 of at least a part of the dummy trench portion 30 through the contact holes 54 and 56 provided in the interlayer dielectric film 38.

The inside gate runner 134 of this example is disposed above the second layer 52-2. However, the inside gate runner 134 is separated from the emitter electrode 52 by the interlayer dielectric films 38. In addition, the surface protection layer 53 is disposed on the sides of and above the inside gate runner 134. In this way, the inside gate runner 134 may be provided after the emitter electrode 52 is formed.

Embodiment 6

Figure 14A:
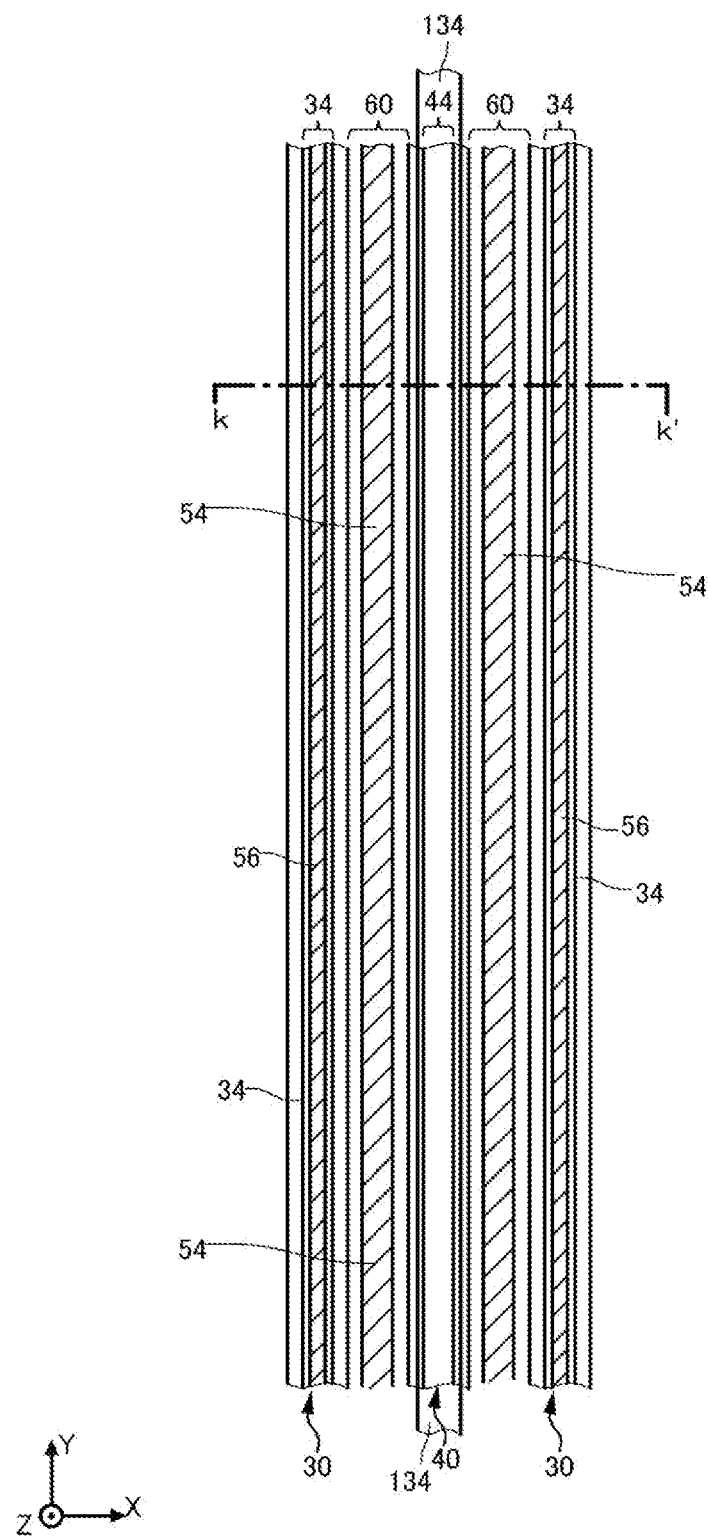
FIG. 14A is a diagram illustrating a partial upper surface of the semiconductor device 100 according to Embodiment 6.

Similarly to FIG. 7, Embodiment 6 is a configuration example in which the gate runner includes the outer peripheral gate runner and the inside gate runner. FIG. 14A is a diagram illustrating a partial upper surface of the semiconductor device 100 according to Embodiment 6. As an example, FIG. 14A corresponds to an enlarged view of Region A in FIG. 7. The inside gate runner 134 of this example is disposed in the emitter electrode 52, but the emitter electrode 52 is omitted for the convenience of explanation. Similarly to FIG. 7, the inside gate runner 134 of this example extends right above either one gate trench portion of the first gate trench portion 45 and the second gate trench portion 46 in the extension direction of the gate trench portion.

Embodiment 6-1

Figure 14B:
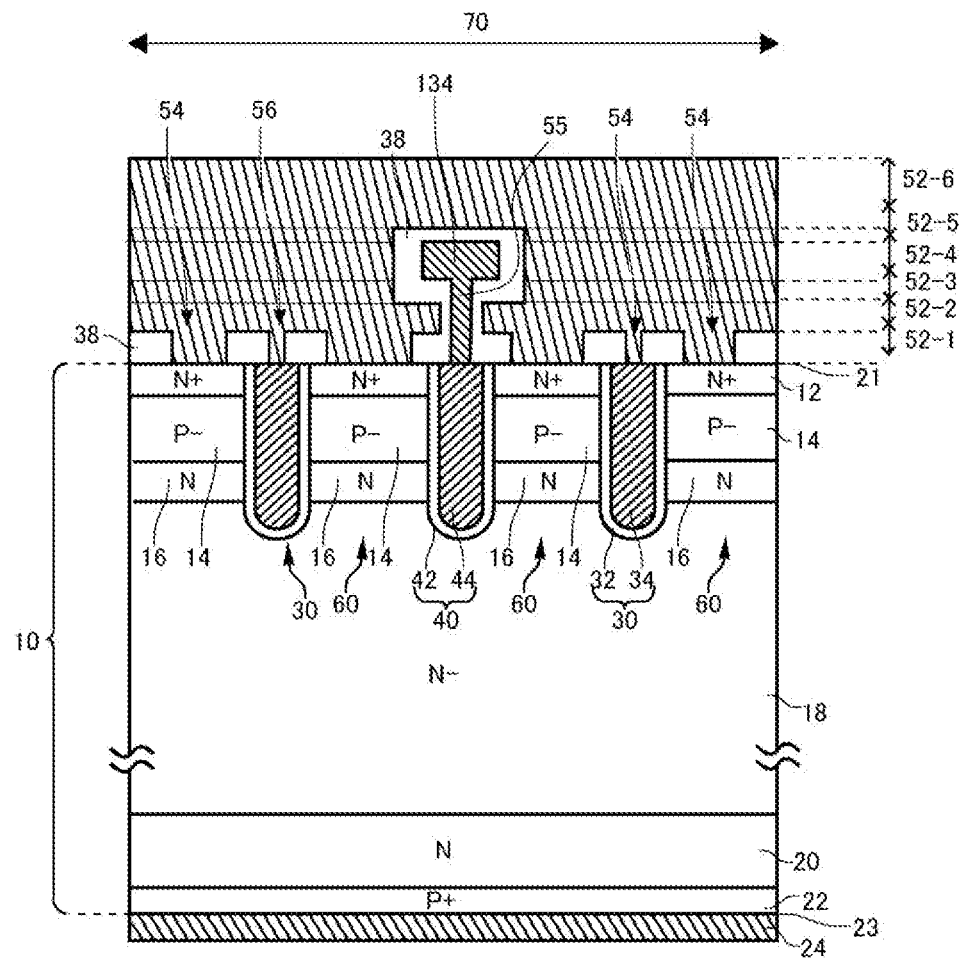
FIG. 14B is a diagram illustrating a partial cross section of the semiconductor device 100 according to Embodiment 6-1.
Figure 14B:
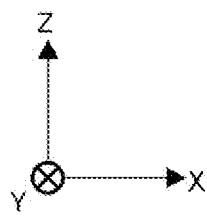

Embodiment 6-1 is an example of Embodiment 6. FIG. 14B is a diagram illustrating a partial cross section of the semiconductor device 100 according to Embodiment 6-1. Specifically, FIG. 14B corresponds to the k-k' cross section in FIG. 14A. The emitter electrode 52 of this example includes the first layer 52-1, the second layer 52-2, the third layer 52-3, the fourth layer 52-4, a fifth layer 52-5, and a sixth layer 52-6. The first layer 52-1, the second layer 52-2, the third layer 52-3, the fourth layer 52-4, the fifth layer 52-5, and the sixth layer 52-6 are stacked sequentially from the upper surface 21 of the semiconductor substrate 10 in the +Z axis direction. As an example, the first layer 52-1, the third layer 52-3, and the fifth layer 52-5 are via layers, and the second layer 52-2, the fourth layer 52-4, and the sixth layer 52-6 are metal layers.

The interlayer dielectric film 38 is disposed in the via layer, and separates the emitter electrode 52 and each trench portion. However, the emitter electrode 52 (the second layer 52-2 of this example) is connected to the mesa portion 60 and the dummy conductive portion 34 of at least a part of the dummy trench portion 30 through the contact holes 54 and 56 provided in the interlayer dielectric film 38.

The inside gate runner 134 of this example is disposed in the fourth layer 52-4. The inside gate runner 134 is separated from the emitter electrode 52 by the interlayer dielectric films 38. The inside gate runner 134 of this example is connected to either one gate conductive portion 44 of the first gate trench portion 45 and the second gate trench portion 46 through the contact hole 55 provided in the interlayer dielectric film 38.

Embodiment 6-2

Figure 15:
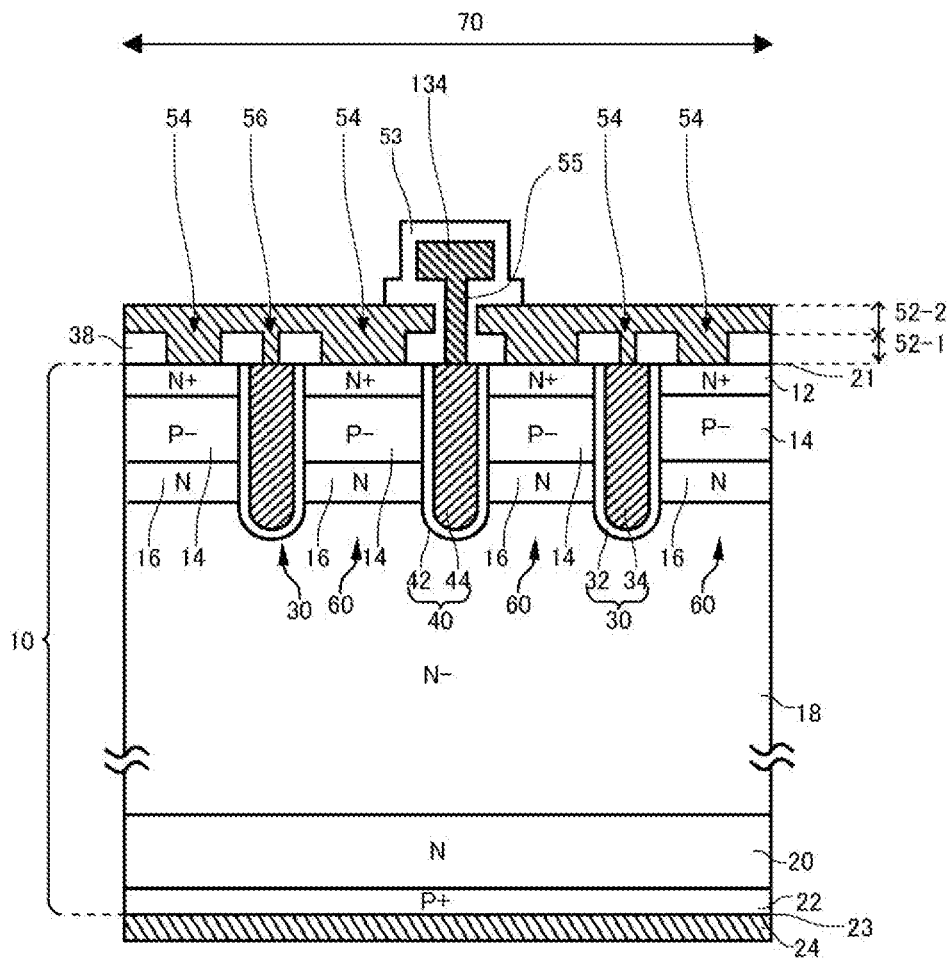
FIG. 15 is a diagram illustrating a partial cross section of the semiconductor device 100 according to Embodiment 6-2.
Figure 15:
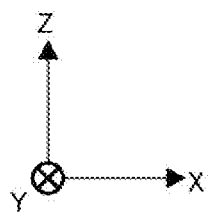

Embodiment 6-2 is another example of Embodiment 6. FIG. 15 is a diagram illustrating a partial cross section of the semiconductor device 100 according to Embodiment 6-2. Specifically, FIG. 15 corresponds to the k-k' cross section in FIG. 14A. The emitter electrode 52 of this example includes the first layer 52-1 and the second layer 52-2. The first layer 52-1 and the second layer 52-2 are stacked sequentially from the upper surface 21 of the semiconductor substrate 10 in the +Z axis direction. As an example, the first layer 52-1 is a via layer, and the second layer 52-2 is a metal layer.

The interlayer dielectric film 38 is disposed in the via layer, and separates the emitter electrode 52 and each trench portion. However, the emitter electrode 52 (the second layer 52-2 of this example) is connected to the mesa portion 60 and the dummy conductive portion 34 of at least a part of the dummy trench portion 30 through the contact holes 54 and 56 provided in the interlayer dielectric film 38.

The inside gate runner 134 of this example is disposed above the second layer 52-2. The inside gate runner 134 is separated from the emitter electrode 52 by the interlayer dielectric films 38. In addition, the surface protection layer 53 is disposed on the sides of and above the inside gate runner 134. The inside gate runner 134 of this example is connected to either one gate conductive portion 44 of the first gate trench portion 45 and the second gate trench portion 46 through the contact hole 55 provided in the interlayer dielectric film 38. In this way, the inside gate runner 134 may be provided after the emitter electrode 52 is formed.

Embodiment 7

Figure 16:
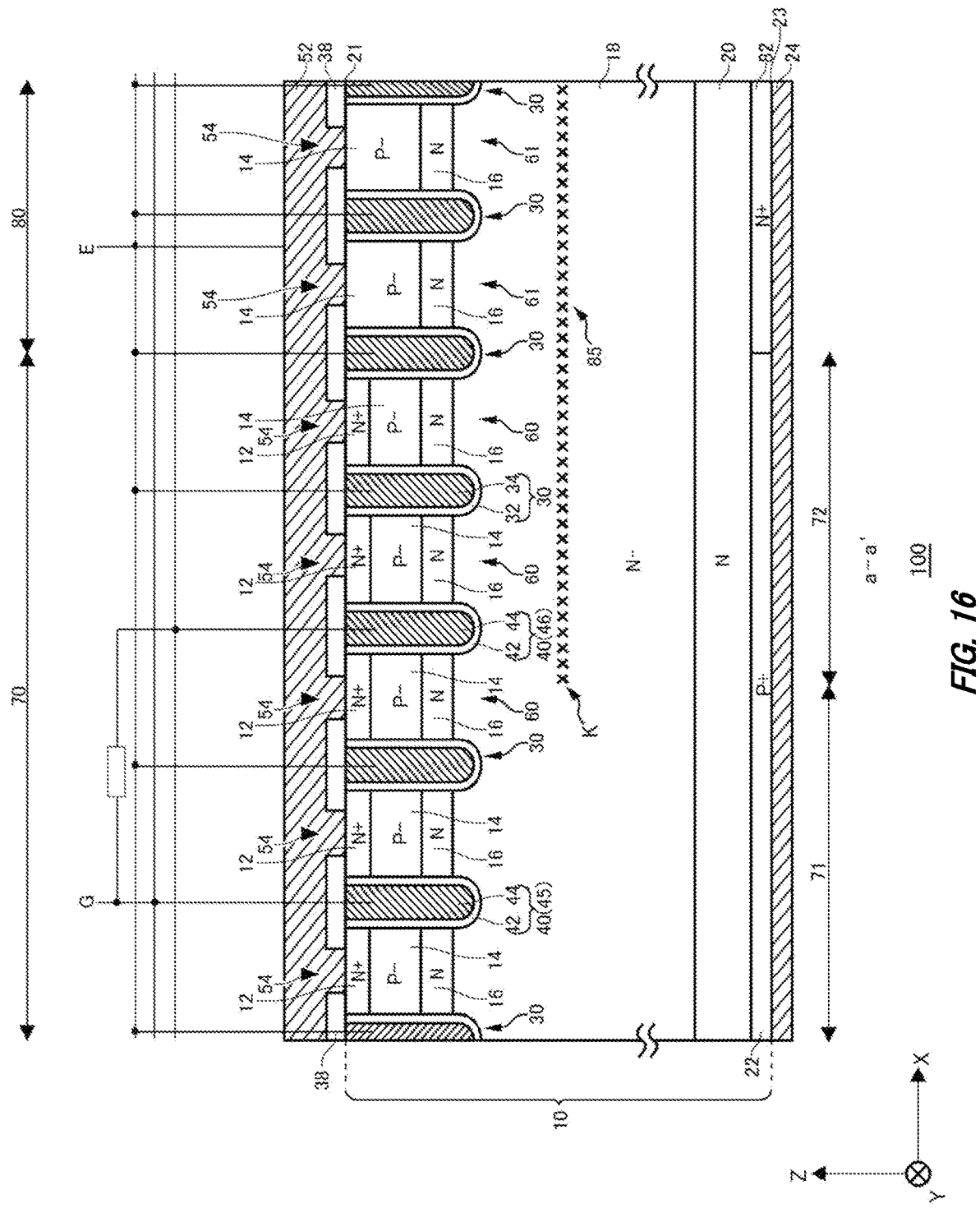
FIG. 16 is a diagram illustrating a partial cross section of the semiconductor device 100 according to Embodiment 7 and electrical connection thereof.

Embodiment 7 is a configuration example in which the semiconductor device 100 includes one gate pad and two gate runners, and the ON timings are matched. FIG. 16 is a diagram illustrating a partial cross section of the semiconductor device 100 according to Embodiment 7 and electrical connection thereof. The cross section illustrated in FIG. 16 corresponds to the a-a' cross section in FIG. 2.

The gate resistance component of the first gate trench portion 45 of this example is smaller than the gate resistance component of the second gate trench portion 46. With this configuration, the signal transmission from the gate pad G to the second gate trench portion 46 is slower than the signal transmission to the first gate trench portion 45, and the ON timings can be matched.

For example, FIGS. 4 to 5 illustrate the configuration examples of the gate runner to match the OFF timings, but the ON timings can be matched by modifying the configuration as below. For example, unlike FIG. 4, the first gate runner 131 is disposed between the second gate runner 132 and the outer periphery of the active region 160. In this case, the resistance of the second gate runner 132 becomes larger than the resistance of the first gate runner 131. With this configuration, the signal transmission from the gate pad G to the second gate trench portion 46 is slower than the signal transmission to the first gate trench portion 45, and the ON timings can be matched.

In addition, the first gate runner 131 may be formed of an aluminum silicon alloy, and the second gate runner 132 may be formed of polysilicon. In other words, the second gate runner 132 formed of polysilicon has a resistance larger than the first gate runner 131 formed of an aluminum silicon alloy. With this configuration, the signal transmission from the gate pad G to the second gate trench portion 46 is slower than the signal transmission to the first gate trench portion 45, and the ON timings can be matched.

In addition, the cross-sectional area of the first gate runner 131 may be set larger than the cross-sectional area of the second gate runner 132. In other words, the second gate runner 132 with a smaller cross-sectional area has a resistance smaller than the first gate runner 131. With this configuration, the signal transmission from the gate pad G to the second gate trench portion 46 is slower than the signal transmission to the first gate trench portion 45, and the ON timings can be matched.

In addition, FIG. 6 illustrates a configuration example of the gate trench portion to match the OFF timings, but the ON timings can be matched by modifying the configuration as below. For example, unlike FIG. 6, the cross-sectional area of the first gate trench portion 45 is set larger than the cross-sectional area of the second gate trench portion 46. In other words, the second gate trench portion 46 with a smaller cross-sectional area has a larger resistance than the first gate trench portion 45 since the cross-sectional area of the gate conductive portion 44 is also small. With this configuration, the signal transmission from the gate pad G to the second gate trench portion 46 is slower than the signal transmission to the first gate trench portion 45, and the ON timings can be matched.

Embodiment 8

Figure 17:
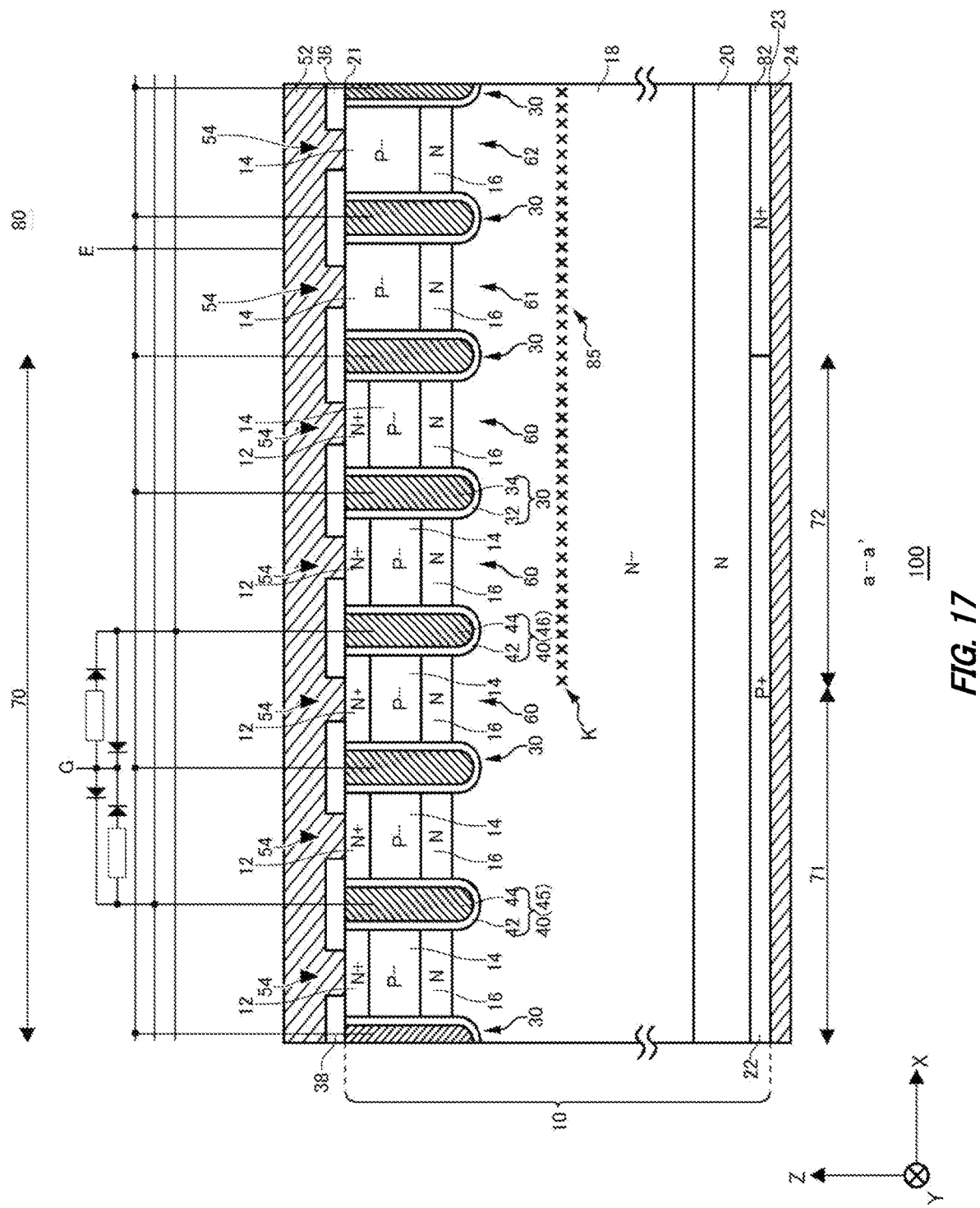
FIG. 17 is a diagram illustrating a partial cross section of the semiconductor device 100 according to Embodiment 8 and electrical connection thereof.

Embodiment 8 is a configuration example in which both the ON and OFF timings are matched. FIG. 17 is a diagram illustrating a partial cross section of the semiconductor device 100 according to Embodiment 8 and electrical connection thereof. The cross section illustrated in FIG. 17 corresponds to the a-a' cross section in FIG. 2.

The semiconductor device 100 of this example further includes paired wirings that include diodes provided in parallel and in reverse directions, respectively, to electrically connect the first gate runner 131 and the gate pad G. The semiconductor device 100 of this example further includes paired wirings that include diodes provided in parallel and in reverse directions, respectively, to electrically connect the second gate runner 132 and the gate pad G. Such paired wirings may be disposed in the vicinity of the gate pad G.

As illustrated in FIG. 17, the paired wirings for electrically connecting the first gate runner 131 and the gate pad G are separated into the ON signal wiring and the OFF signal wiring by the diodes provided in parallel and in reverse directions. In the paired wirings, a resistance component is provided in the ON signal wiring.

In addition, the paired wirings for electrically connecting the second gate runner 132 and the gate pad G are also separated into the ON signal wiring and the OFF signal wiring by the diodes provided in parallel and in reverse directions. In the paired wirings, a resistance component is provided in the OFF signal wiring.

in this way, in the case of the ON signal, the transmission from the gate pad G to the second gate trench portion 46 is slower than the transmission to the first gate trench portion 45, and the ON timings can be matched.

In addition, in the case of the OFF signal, the transmission from the gate pad G to the second gate trench portion 46 becomes faster than the transmission to the first gate trench portion 45, and the OFF timings can be matched.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the operation flow is described using phrases such as "first" or "next" in the claims, embodiments, or diagrams, it does not necessarily mean that the process must be performed in this order.

EXPLANATION OF REFERENCES 10 semiconductor substrate
11 well region
12 emitter region
14 base region
15 contact region
16 accumulation region
18 drift region
20 buffer region
21 upper surface
22 collector region
23 lower surface
24 collector electrode
29 linear portion
30 dummy trench portion
31 edge
32 dummy insulating film
34 dummy conductive portion
38 interlayer dielectric film
39 linear portion
40 gate trench portion
41 edge
42 gate insulating film
44 gate conductive portion
45 first gate trench portion
46 second gate trench portion
47 first gate lead-out conductive portion
48 second gate lead-out conductive portion
49 contact hole
52 emitter electrode
53 surface protection layer
54 contact hole
55 contact hole
56 contact hole
60 mesa portion
61 mesa portion
70 transistor portion
71 main region
72 boundary region
80 diode portion
81 extension region
82 cathode region
85 lifetime control region
90 edge terminal structure portion
100 semiconductor device
102 edge side
131 first gate runner
132 second gate runner
133 outer peripheral gate runner
134 inside gate runner
160 active region

What is claimed is:

1. A semiconductor device, comprising:
   a semiconductor substrate that includes a transistor portion and a diode portion,
   wherein both of the transistor portion and the diode portion include:
   a first conductivity type drift region that is provided in the semiconductor substrate; and
   a second conductivity type base region that is provided above the drift region in the semiconductor substrate,
   wherein, in the semiconductor substrate, a lifetime control region that includes a lifetime killer is provided from at least a part of the transistor portion to the diode portion below the base region,
   wherein the transistor portion includes:
   a main region that is separated from the diode portion when viewed from an upper surface of the semiconductor substrate;
   a boundary region that is located between the main region and the diode portion, and overlapped with the lifetime control region when viewed from the upper surface of the semiconductor substrate; and
   a plurality of gate trench portions that are provided from the upper surface of the semiconductor substrate to the drift region to extend through the base region, wherein the plurality of gate trench portions include:
a first gate trench portion that is provided in the main region; and
a second gate trench portion that is provided in the boundary region, and
wherein a gate resistance component of the first gate trench portion is different from a gate resistance component of the second gate trench portion.

2. The semiconductor device according to claim 1, further comprising:
a first gate runner electrically connected to the first gate trench portion and a second gate runner electrically connected to the second gate trench portion, wherein
when viewed from the upper surface of the semiconductor substrate, the first gate runner and the second gate runner are disposed to surround an active region where a main current flows when the semiconductor device operates.

3. The semiconductor device according to claim 2,
wherein either one of the first gate runner and the second gate runner is disposed between the other one and an outer periphery of the active region.

4. The semiconductor device according to claim 2,
wherein the first gate runner has a cross-sectional area different from the second gate runner.

5. The semiconductor device according to claim 2,
wherein the first gate runner is formed of a material different from the second gate runner.

6. The semiconductor device according to claim 2,
wherein the first gate runner and the second gate runner are electrically connected to the same gate pad.

7. The semiconductor device according to claim 6, further comprising:
paired wirings that include diodes provided in parallel and in reverse directions, respectively, to electrically connect the first gate runner and a gate pad; and
paired wirings that include diodes provided in parallel and in reverse directions, respectively, to electrically connect the second gate runner and the gate pad.

8. The semiconductor device according to claim 2,
wherein the first gate runner and the second gate runner are electrically connected to different gate pads.

9. The semiconductor device according to claim 1, further comprising:
an outer peripheral gate runner that, when viewed from the upper surface of the semiconductor substrate, is disposed to surround an active region where a main current flows when the semiconductor device operates, and electrically connected to the first gate trench portion and the second gate trench portion; and
an inside gate runner that extends inside the outer peripheral gate runner when viewed from the upper surface of the semiconductor substrate, and is electrically connected to the outer peripheral gate runner,
wherein the inside gate runner is electrically connected to either one gate trench portion of the first gate trench portion and the second gate trench portion.

10. The semiconductor device according to claim 9,
wherein the inside gate runner extends right above the either one gate trench portion in an extension direction of the either one gate trench portion when viewed from the upper surface of the semiconductor substrate.

11. The semiconductor device according to claim 9,
wherein an extension direction of the inside gate runner is crossed with an extension direction of the plurality of gate trench portions when viewed from the upper surface of the semiconductor substrate.

12. The semiconductor device according to claim 9, further comprising:
an emitter electrode that is provided in the active region above the semiconductor substrate,
wherein the plurality of gate trench portions further include a dummy trench portion that is electrically connected to the emitter electrode,
wherein the emitter electrode includes a first layer that forms electrical connection to the dummy trench portion, and a second layer that is disposed above the first layer when viewed from the upper surface of the semiconductor substrate, and
wherein the inside gate runner is disposed in the second layer.

13. The semiconductor device according to claim 12,
wherein the diode portion further includes a plurality of gate trench portions that are provided from the upper surface of the semiconductor substrate to the drift region to extend through the base region, and electrically connected to the emitter electrode.

14. The semiconductor device according to claim 9, further comprising:
a surface protection layer that is disposed above the inside gate runner when viewed from the upper surface of the semiconductor substrate.

15. The semiconductor device according to claim 1,
wherein the first gate trench portion has a cross-sectional area different from the second gate trench portion.

16. The semiconductor device according to claim 1,
wherein a gate conductive portion in the first gate trench portion is formed of a material different from a gate conductive portion in the second gate trench portion.

* * * * *